(12) United States Patent
Miura et al.

(10) Patent No.: US 9,894,765 B2
(45) Date of Patent: Feb. 13, 2018

(54) PRINTED WIRING BOARD AND METHOD FOR PRODUCING PRINTED WIRING BOARD

(71) Applicant: SUMITOMO ELECTRIC PRINTED CIRCUITS, INC., Koka-shi, Shiga (JP)

(72) Inventors: Kousuke Miura, Shiga (JP); Satoshi Kiya, Shiga (JP); Sumito Uehara, Shiga (JP)

(73) Assignee: SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 15/311,601

(22) PCT Filed: May 12, 2015

(86) PCT No.: PCT/JP2015/063679
§ 371 (c)(1),
(2) Date: Nov. 16, 2016

(87) PCT Pub. No.: WO2015/178258
PCT Pub. Date: Nov. 26, 2015

(65) Prior Publication Data
US 2017/0118837 A1 Apr. 27, 2017

(30) Foreign Application Priority Data

May 21, 2014 (JP) .................................. 2014-105713
Apr. 28, 2015 (JP) .................................. 2015-091450

(51) Int. Cl.
*H05K 1/09* (2006.01)
*H05K 1/11* (2006.01)
(Continued)

(52) U.S. Cl.
CPC ........... *H05K 1/115* (2013.01); *H05K 1/0313* (2013.01); *H05K 1/09* (2013.01); *H05K 3/4084* (2013.01);
(Continued)

(58) Field of Classification Search
CPC ........ H05K 1/115; H05K 1/0313; H05K 1/09; H05K 3/4084; H05K 3/4611; H05K 3/4661; H05K 2201/09509; H05K 2203/072
(Continued)

(56) References Cited

U.S. PATENT DOCUMENTS

| | | | | | |
|---|---|---|---|---|---|
| 2,897,409 A | * | 7/1959 | Gitto | ...................... | H05K 1/095 |
| | | | | | 174/257 |
| 7,504,719 B2 | * | 3/2009 | En | ............................ | C23G 1/10 |
| | | | | | 257/700 |

(Continued)

FOREIGN PATENT DOCUMENTS

| JP | h04-30594 A | 2/1992 |
|---|---|---|
| JP | 2000-068642 A | 3/2000 |

(Continued)

*Primary Examiner* — Timothy Thompson
*Assistant Examiner* — Michael F McAllister
(74) *Attorney, Agent, or Firm* — Drinker Biddle & Reath LLP

(57) ABSTRACT

An object of the present invention is to provide a printed wiring board in which conductive layers formed on two surfaces of a base layer that contains a fluororesin as a main component are reliably connected to each other through a via-hole. A printed wiring board according to an embodiment of the present invention includes a base layer containing a fluororesin as a main component, a first conductive layer stacked on one surface of the base layer, a second conductive layer stacked on the other surface of the base layer, and a via-hole that is formed along a connection hole penetrating the base layer and at least one of the first (Continued)

conductive layer and the second conductive layer in a thickness direction and that electrically connects the first conductive layer and the second conductive layer to each other. At least a part of an inner circumferential surface of the base layer in the connection hole has a pre-treated surface having a content ratio of oxygen atoms or nitrogen atoms of 0.2 atomic percent or more.

5 Claims, 8 Drawing Sheets

(51) Int. Cl.
    *H05K 3/40*     (2006.01)
    *H05K 1/03*     (2006.01)
    *H05K 3/46*     (2006.01)

(52) U.S. Cl.
    CPC ......... *H05K 3/4611* (2013.01); *H05K 3/4661* (2013.01); *H05K 2201/09509* (2013.01); *H05K 2203/072* (2013.01)

(58) Field of Classification Search
    USPC ........................................................ 174/257
    See application file for complete search history.

(56) References Cited

U.S. PATENT DOCUMENTS

| | | | |
|---|---|---|---|
| 7,743,494 B2 * | 6/2010 | Wang ..................... | H05K 3/429 174/262 |
| 2004/0055503 A1 | 3/2004 | Hasan | |
| 2004/0226745 A1 * | 11/2004 | En ............................. | C25D 3/38 174/262 |
| 2005/0124196 A1 * | 6/2005 | Olson .................... | H05K 3/002 439/260 |
| 2006/0202344 A1 * | 9/2006 | Takada ............. | H01L 23/49822 257/758 |
| 2011/0083883 A1 * | 4/2011 | Yugawa ................. | H05K 3/388 174/256 |

FOREIGN PATENT DOCUMENTS

| | | | |
|---|---|---|---|
| JP | 2000-313963 A | | 11/2000 |
| JP | 2003201571 | * | 7/2003 |
| JP | 2013-049819 A | | 3/2013 |
| JP | 2013-165171 A | | 8/2013 |
| JP | 2013-214785 A | | 10/2013 |

* cited by examiner

PRINTED WIRING BOARD AND METHOD FOR PRODUCING PRINTED WIRING BOARD

TECHNICAL FIELD

The present invention relates to a printed wiring board and a method for producing a printed wiring board.

BACKGROUND ART

In printed wiring boards that transmit electrical signals, with an increase in the frequency of the electrical signals to be transmitted, dielectric loss due to an insulating material disposed around a conductor increases. In view of this, it has been proposed that, in a printed wiring board, a base on which a conductive layer is formed contains, as a main component, a fluororesin having a low dielectric constant and a low dielectric loss tangent (refer to, Japanese Unexamined Patent Application Publication No. 2013-165171).

With the miniaturization of electronic devices, an increase in the wiring density of printed wiring boards has been desired, and thus multilayer printed wiring boards including a plurality of conductive layers are used. In such a multilayer printed wiring board, a via-hole (tubular conductor) that connects conductive layers to each other is formed. A known method for forming such a via-hole includes forming a hole in a printed wiring board, performing electroless plating on an inner circumferential surface of the hole, and then performing electroplating to form a metal layer that connects two or more conducting layers together. A technique has also been proposed in which a layer including conductive fine particles is formed on an inner circumferential surface of a hole of a printed wiring board, and electroless plating and electroplating are then performed (refer to, Japanese Unexamined Patent Application Publication No. 2013-214785).

CITATION LIST

Patent Literature

PTL 1: Japanese Unexamined Patent Application Publication No. 2013-165171
PTL 2: Japanese Unexamined Patent Application Publication No. 2013-214785

SUMMARY OF INVENTION

Technical Problem

When conductive layers are formed on two surfaces of a base layer that contains a fluororesin as a main component and these conductive layers are connected to each other through a via-hole, it is difficult to form the via-hole because of low adhesiveness of the fluororesin surface. For example, in the case where the method for forming a via-hole described in Japanese Unexamined Patent Application Publication No. 2013-214785 is applied to the production of a printed wiring board that includes a base layer containing a fluororesin as a main component, the base containing the fluororesin as a main component repels, for example, an ink containing conductive fine particles, and thus a layer containing the conductive fine particles may not be satisfactorily formed.

The present invention has been made in view of the above problem. An object of the present invention is to provide a printed wiring board in which conductive layers formed on two surfaces of a base layer that contains a fluororesin as a main component are reliably connected to each other through a via-hole, and a method for producing such a printed wiring board.

Solution to Problem

A printed wiring board according to an embodiment of the present invention that has been made in order to achieve the object includes a base layer containing a fluororesin as a main component, a first conductive layer stacked on one surface of the base layer, a second conductive layer stacked on the other surface of the base layer, and a via-hole that is formed along a connection hole penetrating the base layer and at least one of the first conductive layer and the second conductive layer in a thickness direction and that electrically connects the first conductive layer and the second conductive layer to each other. At least a part of an inner circumferential surface of the base layer in the connection hole has a pre-treated surface having a content ratio of oxygen atoms or nitrogen atoms of 0.2 atomic percent or more.

A method for producing a printed wiring board according to another embodiment of the present invention that has been made in order to achieve the object is a method for producing a printed wiring board including a base layer containing a fluororesin as a main component, a first conductive layer stacked on one surface of the base layer, a second conductive layer stacked on the other surface of the base layer, and a via-hole that electrically connects the first conductive layer and the second conductive layer to each other. The methods includes a step of forming a connection hole that penetrates the base layer and at least one of the first conductive layer and the second conductive layer, a step of forming a pre-treated surface having a content ratio of oxygen atoms or nitrogen atoms of 0.2 atomic percent or more on at least a part of an inner circumferential surface of the base layer in the connection hole, and a step of forming the via-hole by forming an underlying conductor layer and a main conductor layer on an inner circumferential surface of the connection hole.

Advantageous Effects of Invention

According to the printed wiring board of the present invention, conductive layers formed on two surfaces of a base layer that contains a fluororesin as a main component are reliably connected to each other through a via-hole. According to the method for producing a printed wiring board of the present invention, conductive layers formed on two surfaces of a base layer that contains a fluororesin as a main component can be reliably connected to each other through a via-hole.

DESCRIPTION OF EMBODIMENTS

Description of Embodiments of Present Invention

Figure 1:
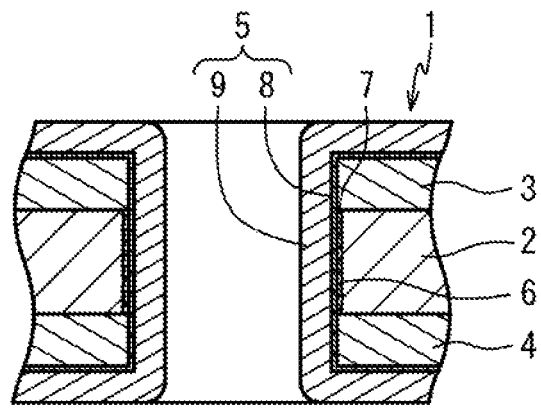
FIG. 1 is a schematic partial sectional view illustrating a printed wiring board according to an embodiment of the present invention.

A printed wiring board according to an embodiment of the present invention includes a base layer containing a fluororesin as a main component, a first conductive layer stacked on one surface of the base layer, a second conductive layer stacked on the other surface of the base layer, and a via-hole that is formed along a connection hole penetrating the base layer and at least one of the first conductive layer and the second conductive layer in a thickness direction and that electrically connects the first conductive layer and the second conductive layer to each other. At least a part of an inner circumferential surface of the base layer in the connection hole has a pre-treated surface having a content ratio of oxygen atoms or nitrogen atoms of 0.2 atomic percent or more.

Since the printed wiring board includes the pre-treated surface having a content ratio of oxygen atoms or nitrogen atoms of 0.2 atomic percent or more on at least a part of an inner circumferential surface of the base layer in the connection hole, this pre-treated surface exhibits high adhesion to the via-hole. With this structure, the first conductive layer and the second conductive layer disposed on both sides of the base layer can be reliably connected to each other through the via-hole, and the pre-treated surface prevents the via-hole from separating. Therefore, the printed wiring board has high reliability. Furthermore, since the printed wiring board includes the pre-treated surface, the via-hole can be easily formed. Accordingly, the printed wiring board can be easily produced and provided at a low cost.

The printed wiring board preferably further includes a modified layer having a hydrophilic organic functional group in at least a region of the inner circumferential surface of the base layer in the connection hole, the region having the pre-treated surface. By providing a modified layer having a hydrophilic organic functional group in at least a region of the inner circumferential surface of the base layer in the connection hole, the region having the pre-treated surface, adhesion between the base layer and the via-hole is further increased, and production efficiency and reliability can be further improved.

The via-hole preferably includes an underlying conductor layer that is in contact with an inner circumferential surface of the connection hole, and a main conductor layer that is in contact with an inner circumferential surface of the underlying conductor layer. By providing a main conductor layer on an underlying conductor layer, the via-hole that connects the first conductive layer and the second conductive layer to each other can be easily and reliably formed.

A contact angle of the pre-treated surface with respect to pure water is preferably 90° or less. In the case where a contact angle of the pre-treated surface with respect to pure water is the upper limit or less, the via-hole can be easily formed, and the first conductive layer and the second conductive layer can be more reliably connected to each other.

A peel strength between the via-hole and the base layer is preferably 1.0 N/cm or more. In the case where a peel strength between the via-hole and the base layer is the lower limit or more, separation of the via-hole from the inner circumferential surface of the base layer in the connection hole and consequent separation of the via-hole from the first conductive layer and the second conductive layer are prevented. Accordingly, the first conductive layer and the second conductive layer are more reliably connected to each other.

A method for producing a printed wiring board according to another embodiment of the present invention is a method for producing a printed wiring board including a base layer containing a fluororesin as a main component, a first conductive layer stacked on one surface of the base layer, a second conductive layer stacked on the other surface of the base layer, and a via-hole that electrically connects the first conductive layer and the second conductive layer to each other. The method includes a step of forming a connection hole that penetrates the base layer and at least one of the first conductive layer and the second conductive layer, a step of forming a pre-treated surface having a content ratio of oxygen atoms or nitrogen atoms of 0.2 atomic percent or more on at least a part of an inner circumferential surface of the base layer in the connection hole, and a step of forming the via-hole by forming an underlying conductor layer and a main conductor layer on an inner circumferential surface of the connection hole.

According to the method for producing a printed wiring board, adhesiveness between a base layer and a via-hole is improved by forming a pre-treated surface having a content ratio of oxygen atoms or nitrogen atoms of 0.2 atomic percent or more on at least a part of an inner circumferential surface of the base layer in a connection hole. Therefore, the via-hole is easily formed by forming an underlying conductor layer and a main conductor layer, and the first conductive layer and the second conductive layer can be easily and reliably connected to each other. Thus, the method for producing a printed wiring board can provide an inexpensive and highly reliable printed wiring board.

The underlying conductor layer is preferably formed by adhesion of a conductive material or by electroless copper plating. In the case where the underlying conductor layer is formed by adhesion of a conductive material or by electroless copper plating, the underlying conductor layer can be easily formed, and furthermore, the main conductor layer can be reliably formed.

Herein, the "content ratio of oxygen atoms or nitrogen atoms" can be measured by, for example, electron spectroscopy for chemical analysis (ESCA) or X-ray photoelectron spectroscopy (XPS), energy dispersive X-ray spectroscopy (EDX) or energy dispersive X-ray spectroscopy (EDS), electron probe micro analysis (EPMA), time of flight secondary ion mass spectrometry (TOF-SIMS), secondary ion mass spectrometry (SIMS), auger electron spectroscopy (AES), or electron microscopy. In the case of ESCA or XPS, the measurement can be performed by scanning a surface under the measurement conditions of an X-ray source of a K-alpha line of aluminum metal, a beam diameter of 50 µm, and an X-ray incident angle of 45° with respect to the analysis surface. For example, "Quantera" manufactured by ULVAC-Phi, Incorporated can be used as an apparatus. A measurement surface (such as a pre-treated surface) during the measurement can be exposed by removing a conducive layer (such as a metal) that covers the measurement surface by, for example, etching. In the case where a measurement surface is not exposed, the material is sequentially removed by sputtering in a direction perpendicular to the measurement surface, and the composition ratio of atoms at a position at any depth can be thereby determined by any of the above methods. Even on a cross section of a measurement surface, an evaluation may be performed by using the above methods in combination to measure the content ratio of oxygen atoms or nitrogen atoms on the surface. For example, the thickness of a surface-treated layer may be measured with an electron microscope while the impurity concentration is analyzed in the depth direction by, for example, SIMS while removing the material by sputtering in a direction substantially parallel to the measurement surface. The term "contact angle with respect to pure water" refers to a value of a contact angle measured by the sessile drop method in accordance with JIS-R-3257 (1999). The term "peel strength" refers to a value measured in accordance with JIS-K-6854-2 (1999) "Adhesives-Determination of peel strength of bonded assemblies-Part 2: 180° peel".

Details of Embodiments of Present Invention

Printed wiring boards according to embodiments of the present invention will be described in detail below with reference to the drawings.

First Embodiment

A printed wiring board 1 illustrated in FIG. 1 mainly includes a base layer 2 containing a fluororesin as a main component, a first conductive layer 3 stacked on one surface of the base layer 2, a second conductive layer 4 stacked on the other surface of the base layer 2, and a via-hole 5 that is formed along a connection hole penetrating the base layer 2, the first conductive layer 3, and the second conductive layer 4 in a thickness direction and that electrically connects the first conductive layer 3 and the second conductive layer 4 to each other. The base layer 2 includes a pre-treated surface 6 having a content ratio of oxygen atoms or nitrogen atoms of 0.2 atomic percent or more on an inner circumferential surface of the base layer 2 in the connection hole. The printed wiring board 1 further includes a modified layer 7 that is disposed in at least a region of the inner circumferential surface of the connection hole, the region having the pre-treated surface 6, and that has a hydrophilic organic functional group.

<Base Layer>

The base layer 2 contains a fluororesin as a main component. Herein, the term "fluororesin" refers to a resin in which at least one hydrogen atom bonded to a carbon atom that forms a repeating unit of a polymer chain is substituted with a fluorine atom or an organic group containing a fluorine atom (hereinafter may be referred to as "fluorine atom-containing group"). The fluorine atom-containing group is a group in which at least one hydrogen atom in a linear or branched organic group is substituted with a fluorine atom. Examples of the fluorine atom-containing group include fluoroalkyl groups, fluoroalkoxy groups, and fluoropolyether groups.

The term "fluoroalkyl group" refers to an alkyl group in which at least one hydrogen atom is substituted with a fluorine atom and covers a "perfluoroalkyl group". Specifically, the term "fluoroalkyl group" covers, for example, a group in which all hydrogen atoms of an alkyl group are each substituted with a fluorine atom, and a group in which all hydrogen atoms other than one hydrogen atom at the end of an alkyl group are each substituted with a fluorine atom.

The term "fluoroalkoxy group" refers to an alkoxy group in which at least one hydrogen atom is substituted with a fluorine atom and covers a "perfluoroalkoxy group". Specifically, the term "fluoroalkoxy group" covers, for example, a group in which all hydrogen atoms of an alkoxy group are each substituted with a fluorine atom, and a group in which all hydrogen atoms other than one hydrogen atom at the end of an alkoxy group are each substituted with a fluorine atom.

The term "fluoropolyether group" refers to a monovalent group that has an oxyalkylene unit as a repeating unit and has an alkyl group or a hydrogen atom at an end thereof, the monovalent group being a group in which at least one hydrogen atom of the alkylene oxide chain or the alkyl group at the end is substituted with a fluorine atom. The term "fluoropolyether group" covers a "perfluoropolyether group" that has a plurality of perfluoroalkylene oxide chains as a repeating unit.

Examples of the fluororesin that forms the base layer 2 include polytetrafluoroethylene (PTFE), polytetrafluoroethylene-perfluoroalkyl vinyl ether copolymers (PFA), tetrafluoroethylene-hexafluoropropylene copolymers (FEP), tetrafluoroethylene-ethylene copolymers (ETFE), polyvinylidene fluoride (PVDF), polychlorotrifluoroethylene (PCTFE), ethylene-chlorotrifluoroethylene copolymers (ECTFE), polyvinyl fluoride (PVF), and thermoplastic fluororesins (THV) and fluoroelastomers obtained from three monomers of tetrafluoroethylene, hexafluoropropylene, and vinylidene fluoride. Mixtures and copolymers containing these compounds can also be used as the material of the base layer 2.

Among these, a tetrafluoroethylene-hexafluoropropylene copolymer (FEP), a polytetrafluoroethylene-perfluoroalkyl vinyl ether copolymer (PFA), or polytetrafluoroethylene (PTFE) is preferred as the fluororesin that forms the base layer 2. Use of any of these fluororesins provides the base layer 2 with flexibility, optical transparency, heat resistance, and flame retardancy.

The base layer 2 may contain, as optional components, for example, an engineering plastic, a flame retardant, a flame retardant assistant, a pigment, an antioxidant, a reflection-imparting agent, a masking reagent, a lubricant, a processing stabilizer, a plasticizer, and a foaming agent.

The engineering plastic may be selected from known engineering plastics such as polyacetal, polyamide, polycarbonate, modified polyphenylene ether, polybutylene terephthalate, and a liquid-crystal polymer in accordance with properties required for the base layer 2 and used. Typically, an aromatic polyether ketone resin can be used.

This aromatic polyether ketone is a thermoplastic resin having a structure in which benzene rings are bonded in the para-position and the benzene rings are connected together through a rigid ketone bond (—C(=O)—) or a flexible ether bond (—O—). Examples of the aromatic polyether ketone include polyether ether ketones (PEEK) having a structural unit in which an ether bond, a benzene ring, an ether bond, a benzene ring, a ketone bond, and a benzene ring are arranged in that order and polyether ketones (PEK) having a structural unit in which an ether bond, a benzene ring, a ketone bond, and a benzene ring are arranged in that order. Among these, PEEK is preferred as the aromatic polyether ketone. Such aromatic polyether ketones have, for example, good wear resistance, heat resistance, insulating properties, and processability.

Commercially available aromatic polyether ketones may be used as the aromatic polyether ketones such as PEEK. Various grades of aromatic polyether ketones are commercially available. A single grade of a commercially available aromatic polyether ketone may be used alone. Alternatively, a plurality of grades of commercially available aromatic polyether ketones may be used in combination. Modified aromatic polyether ketones may also be used.

The lower limit of a ratio of the total content of the engineering plastic in the base layer 2 to the fluororesin is not particularly limited, but is preferably 10% by mass, more preferably 20% by mass, and still more preferably 35% by mass. The upper limit of the ratio of the total content of the engineering plastic to the fluororesin is not particularly limited, but is preferably 50% by mass, and more preferably 45% by mass. When the total content of the engineering plastic is less than the lower limit, properties of the base layer 2 may not be sufficiently improved. When the total content of the engineering plastic exceeds the upper limit, advantageous properties of the fluororesin may not be sufficiently exhibited.

Various publicly known flame retardants can be used as the flame retardant. Examples thereof include halogen-based flame retardants such as bromine-based flame retardants and chlorine-based flame retardants.

Various publicly known flame retardant assistants can be used as the flame retardant assistant. An example thereof is antimony trioxide.

Various publicly known pigments can be used as the pigment. An example thereof is titanium oxide.

Various publicly known antioxidants can be used as the antioxidant. Examples thereof include phenol-based antioxidants.

Various publicly known reflection-imparting agents can be used as the reflection-imparting agent. An example thereof is a titanium oxide.

The base layer 2 includes a hollow structure.

The lower limit of the average thickness of the base layer 2 is preferably 3 and more preferably 6 μm. The upper limit of the average thickness of the base layer 2 is preferably 100 μm, and more preferably 55 When the average thickness of the base layer 2 is less than the lower limit, strength of the printed wiring board 1 may be insufficient. When the average thickness of the base layer 2 exceeds the upper limit, flexibility of the base layer 2, and furthermore, flexibility of the printed wiring board 1 may be insufficient.

(Pre-Treated Surface)

The pre-treated surface 6 is formed by a surface treatment on a surface (an inner circumferential surface of the connection hole) of the base layer 2 and contains oxygen atoms or nitrogen atoms. In other words, this pre-treated surface 6 is a surface having an atomic composition different from that of the inside of the base layer 2. The pre-treated surface 6 is formed over the entire inner circumferential surface of the base layer in the connection hole.

The lower limit of the content ratio of oxygen atoms or nitrogen atoms in the pre-treated surface 6 is 0.2 atomic percent, preferably 1 atomic percent, and more preferably 5 atomic percent. The upper limit of the content ratio of oxygen atoms or nitrogen atoms in the pre-treated surface 6 is preferably 30 atomic percent, and more preferably 20 atomic percent. When the content ratio of oxygen atoms or nitrogen atoms in the pre-treated surface 6 is less than the lower limit, adhesion of the pre-treated surface 6 to the via-hole 5 may be insufficient. When the content ratio of oxygen atoms or nitrogen atoms in the pre-treated surface 6 exceeds the upper limit, the dielectric constant and the dielectric loss tangent of the fluororesin may increase. The term "adhesion of pre-treated surface 6 to via-hole 5" refers to the degree of difficulty of separation of the via-hole 5 not only in the case where the via-hole 5 is formed directly on the pre-treated surface 6 but also in the case where the via-hole 5 is formed on the pre-treated surface 6 with the modified layer 7 therebetween.

The upper limit of the contact angle of the pre-treated surface 6 with respect to pure water is preferably 90°, and more preferably 80°. The lower limit of the contact angle of the pre-treated surface 6 with respect to pure water is not particularly limited. When the contact angle of the pre-treated surface 6 with respect to pure water exceeds the upper limit, adhesive strength between the pre-treated surface 6 and the via-hole 5 or the modified layer 7 may be insufficient. The contact angle with respect to pure water may be measured by using, for example, a contact angle meter "G-I-1000" manufactured by ERMA Inc.

The lower limit of a wetting tension of the pre-treated surface 6 is preferably 50 mN/m, and more preferably 60 mN/m. When the wetting tension of the pre-treated surface 6 is less than the lower limit, an adhesive force between the pre-treated surface 6 and the via-hole 5 may be insufficient, and the via-hole 5 may be separated. The lower limit of the wetting tension is larger than the wetting tension of pure polytetrafluoroethylene (PTFE). Specifically, the adhesion of the surface of the base layer 2 becomes higher than that of typical fluororesins as a result of the formation of the pre-treated surface 6.

<Conductive Layers>

The first conductive layer 3 and the second conductive layer 4 are layers formed of a conductive material such as a metal and each have a planar shape including, for example, wiring of electrical circuits and lands for mounting electrical components. The planar shape of each of the first conductive layer 3 and the second conductive layer 4 is formed by, for example, etching the conductive material stacked on the base layer 2. The material that forms the first conductive layer 3 and the second conductive layer 4 is a material having conductivity. The first conductive layer 3 and the second conductive layer 4 are preferably formed of a metal such as copper, stainless steel, aluminum, or nickel, and typically formed of copper.

The lower limit of the average thickness of the first conductive layer 3 and the second conductive layer 4 is preferably 0.01 µm, and more preferably 0.1 µm. The upper limit of the average thickness of the first conductive layer 3 and the second conductive layer 4 is preferably 100 µm, and more preferably 20 µm. When the average thickness of the first conductive layer 3 and the second conductive layer 4 is less than the lower limit, it is relatively difficult to form a continuous layer, and the first conductive layer 3 and the second conductive layer 4 may easily tear. When the average thickness of the first conductive layer 3 and the second conductive layer 4 exceeds the upper limit, flexibility of the printed wiring board 1 may be insufficient.

<Via-Hole>

The via-hole 5 includes an underlying conductor layer 8 and a main conductor layer 9. The underlying conductor layer 8 is formed so as to be in contact with an inner circumferential surface of the connection hole, the inner circumferential surface having the modified layer 7 thereon (inner circumferential surface of the modified layer 7), end faces of the first conductive layer 3 and the second conductive layer 4 in the connection hole (inner circumferential surface of the connection hole), a region of the outer surface of the first conductive layer 3, the region being located near the connection hole (surface on the opposite side of the base layer 2), and a region of the outer surface of the second conductive layer 4, the region being located near the connection hole (surface on the opposite side of the base layer 2). The main conductor layer 9 is formed so as to be in contact with an inner circumferential surface and outer surfaces (surfaces on the side facing away from the base layer 2) of the underlying conductor layer 8.

The lower limit of the peel strength between the via-hole 5 and the base layer 2 is preferably 1.0 N/cm, more preferably 1.5 N/cm, and still more preferably 2.0 N/cm. The upper limit of the peel strength between the via-hole 5 and the base layer 2 is not particularly limited. When the peel strength between the via-hole 5 and the base layer 2 is less than the lower limit, the via-hole 5 may be separated from the base layer 2, which may result in separation or tearing of a portion connected to the first conductive layer 3 or the second conductive layer 4.

(Underlying Conductor Layer)

The underlying conductor layer 8 is a thin layer having conductivity and is used as an adherend when the main conductor layer 9 is formed by electroplating. The underlying conductor layer 8 is formed of a metal deposited by electroless plating. Examples of the metal that forms the underlying conductor layer 8 include metals such as copper, silver, nickel, and palladium. Among these, copper, which has good flexibility, good thick-film formability, good adhesion with copper electroplating, and a low electrical resistance, is suitable.

When the underlying conductor layer 8 is formed by electroless copper plating, the lower limit of the average thickness of the underlying conductor layer 8 is preferably 0.01 µm, and more preferably 0.2 µm. The upper limit of the average thickness of the underlying conductor layer 8 is preferably 1 µm, and more preferably 0.5 µm. When the average thickness of the underlying conductor layer 8 is less than the lower limit, continuity of the underlying conductor layer 8 cannot be ensured, and the main conductor layer 9 may not be uniformly formed. When the average thickness of the underlying conductor layer 8 exceeds the upper limit, the cost may be unnecessarily increased.

(Main Conductor Layer)

The main conductor layer 9 is formed of a metal, such as copper or nickel, deposited on the underlying conductor layer 8 by electroplating. By forming the underlying conductor layer 8 and subsequently providing the main conductor layer 9 on the inner circumferential surface of the underlying conductor layer 8, a via-hole 5 having good conductivity can be easily and reliably formed.

The lower limit of the average thickness of the main conductor layer 9 is preferably 1 µm, and more preferably 5 µm. The upper limit of the average thickness of the main conductor layer 9 is preferably 50 µm, and more preferably 30 µm. When the average thickness of the main conductor layer 9 is less than the lower limit, the via-hole 5 may be broken by, for example, bending of the printed wiring board 1, and electrical connection between the first conductive layer 3 and the second conductive layer 4 may be disconnected. When the average thickness of the main conductor layer 9 exceeds the upper limit, the printed wiring board 1 may have an excessively large thickness, or the production cost may increase.

<Modified Layer>

The modified layer 7 has a hydrophilic organic functional group, which is easily bonded to, for example, a metal, in at least a region of the inner circumferential surface of the base layer 2 in the connection hole, the region having the pre-treated surface 6. Thus, the modified layer 7 further improves adhesiveness between the base layer 2 and the underlying conductor layer 8.

The modified layer 7 preferably includes a siloxane bond (Si—O—Si). Specifically, the modified layer 7 is preferably formed by bonding, to the fluororesin, which is a main component of the base layer 2, a modifier (silane coupling agent) that has a hydrophilic organic functional group and that forms a siloxane bond. In the modified layer 7, the hydrophilic organic functional group is bonded to a Si atom that forms a siloxane bond. This hydrophilic organic functional group provides wettability to the surface side of the base layer 2. Herein, the chemical bonds between the fluororesin and the modifier may include covalent bonds alone or covalent bonds and hydrogen bonds. The modified layer 7 is a region that is believed to have a microstructure, a molecular structure, and an existing ratio of elements that are different from those in a region except for the modified layer 7 near the surface of the base layer 2. Since the modified layer 7 has a hydrophilic organic functional group, the base layer 2 becomes hydrophilic to improve wettability of the surface thereof. Therefore, in the case where the underlying conductor layer 8 is formed on the inner circumferential surface of the modified layer 7 using a polar solvent, the treatment speed and the uniformity of the surface treatment (absence of unevenness of the treatment) can be improved.

In the modified layer 7, a Si atom that forms a siloxane bond (this atom is hereinafter referred to as "Si atom of a siloxane bond") is covalently bonded to a C atom of the base layer 2 with at least one atom of a N atom, a C atom, an O atom, and a S atom therebetween. For example, the Si atom of a siloxane bond is boded to a C atom of a fluororesin with an atomic group such as —O—, —S—, —S—S—, —$(CH_2)_n$—, —NH—, —$(CH_2)_n$—NH—, or —$(CH_2)_n$—O—$(CH_2)_m$— (where n and m are each an integer of 1 or more) therebetween.

The hydrophilic organic functional group is preferably a hydroxyl group, a carboxy group, a carbonyl group, an amino group, an amide group, a sulfide group, a sulfonyl group, a sulfo group, a sulfonyldioxy group, an epoxy group, a methacrylic group, or a mercapto group. Among these groups, groups having a N atom or a S atom is more preferable. These hydrophilic organic functional groups further improve adhesion of the surface of the base layer 2. The modified layer 7 may have two or more of these hydrophilic organic functional groups. By providing the modified layer 7 with hydrophilic organic functional groups having different properties, for example, reactivity of the surface of the base layer 2 can be varied. These hydrophilic organic functional groups are each bonded to a Si atom, which is a constituent element of a siloxane bond, either directly or with one or a plurality of C atoms (for example, a methylene group or a phenylene group) therebetween.

The modifier for forming the modified layer 7 having the features described above is suitably a silane coupling agent having a hydrophilic organic functional group in the molecule thereof. In particular, a silane coupling agent having a hydrolyzable silicon-containing functional group containing a Si atom is more suitable. Such a silane coupling agent is chemically bonded to a fluororesin that forms the base layer 2. The chemical bonds between the silane coupling agent and the fluororesin of the base layer 2 may include covalent bonds alone or covalent bonds and hydrogen bonds. Herein, the term "hydrolyzable silicon-containing functional group" refers to a group that can form a silanol group (Si—OH) as a result of hydrolysis.

The upper limit of the contact angle of the surface of the modified layer 7 with respect to pure water is 90°, preferably 80°, and more preferably 70°. When the contact angle of the surface of the modified layer 7 with respect to pure water exceeds the upper limit, adhesive strength with a bonded object such as a conductive pattern, may be insufficient. The lower limit of the contact angle of the surface of the modified layer 7 with respect to pure water is not particularly limited.

The modified layer 7 preferably has the following etching resistance. Specifically, preferably, the modified layer 7 is not removed in an etching treatment including immersion using an etchant that contains iron chloride and that has a specific gravity of 1.33 g/cm$^3$ and a free hydrochloric acid concentration of 0.2 mol/L at 45° C. for 2 minutes. Herein, the phrase "modified layer 7 is not removed" means that hydrophilicity is not lost, and that the contact angle with respect to pure water does not exceed 90° in a portion where the modified layer 7 is provided. As a result of the etching treatment, very small portions that exhibit hydrophobicity may be generated in a spotted manner in a region where the modified layer 7 is formed. However, when the region exhibits hydrophilicity as a whole, it is assumed that this state maintains hydrophilicity.

The modified layer 7 preferably has etching resistance to an etchant containing copper chloride. It has been confirmed that when a modified layer 7 has the etching resistance to an etchant containing iron chloride, this modified layer 7 has the etching resistance to an etchant containing copper chloride.

The lower limit of adhesion energy between the surface of the modified layer 7 and water is preferably 50 dyne/cm. When the adhesion energy between the surface of the modified layer 7 and water is less than the lower limit, adhesion of the surface of the base layer 2 may become insufficient compared with pure polytetrafluoroethylene (PTFE).

The lower limit of the wetting tension of the surface of the modified layer 7 is preferably 50 mN/m, and more preferably 60 mN/m. A wetting tension less than the lower limit may result in an insufficient adhesive force and cause separation of a bonded object from the modified layer 7. Since the lower limit of the wetting tension is larger than the wetting tension of pure polytetrafluoroethylene (PTFE), the surface of the modified layer 7 has an improved adhesion. On the other hand, when the wetting tension of the surface of the modified layer 7 is less than the lower limit, adhesion of the surface of the modified layer 7 may be insufficient. The "wetting tension" is a value measured in accordance with JIS-K-6768 (1999).

The lower limit of a peel strength of an epoxy resin adhesive having an average thickness of 25 μm to the surface of the modified layer 7, the peel strength being measured using a polyimide sheet having an average thickness of 12.5 μm as a flexible adherend, is preferably 1.0 N/cm, more preferably 3.0 N/cm, and still more preferably 5.0 N/cm. When the peel strength of an epoxy resin adhesive to the surface of the modified layer 7 is less than the lower limit, adhesion of the via-hole 5 to the modified layer 7 may not be sufficiently improved.

The lower limit of the average thickness of the modified layer 7 is not particularly limited, but is preferably 10 nm, and more preferably 50 nm. The upper limit of the average thickness of the modified layer 7 is preferably 400 nm, and more preferably 200 nm. When the average thickness of the modified layer 7 is less than the lower limit, the surface of the base layer 2 is not sufficiently modified, and separation of the via-hole 5 may not be prevented. When the average thickness of the modified layer 7 exceeds the upper limit, transmission loss may increase because the dielectric constant (s) and the dielectric loss tangent (tan δ) of the modified layer 7 are larger than those of fluororesins. The average thickness of the modified layer 7 may be measured by using, for example, an optical interference film thickness meter, an X-ray photoelectron spectrometer (XPS), or an electron microscope.

The upper limit of the average surface roughness Ra of the inner circumferential surface of the modified layer 7 is preferably 4 µm, more preferably 2 µm, and still more preferably 1 µm. When the average surface roughness Ra of the inner circumferential surface of the modified layer 7 exceeds the upper limit, irregularities may be formed on the outer circumferential surface of the via-hole 5 formed on the inner circumferential surface of the modified layer 7, which may result in an increase in transmission delay and transmission loss of high-frequency signals. The term "average surface roughness Ra" refers to an arithmetic mean roughness measured in accordance with JIS-B-0601 (2013).

The modified layer 7 is preferably formed at least after the pre-treated surface 6 is formed on the inner circumferential surface of the connection hole formed in the base layer 2. Since the formation of the pre-treated surface 6 improves adhesion of an end face of the base layer 2, the modified layer 7 is easily formed, and adhesion of the via-hole 5 further improves.

[Method for Producing Printed Wiring Board]

A method for producing the printed wiring board 1 includes a step of preparing a layered product including a base layer 2, a first conductive layer 3, and a second conductive layer 4 (layered product preparation step), a step of forming a connection hole in the layered product (connection hole formation step), a step of forming a pre-treated surface 6 having a content ratio of oxygen atoms or nitrogen atoms of 0.2 atomic percent or more on an inner circumferential surface of the base layer 2 in the formed connection hole (pre-treated surface formation step), a step of forming a modified layer 7 having a hydrophilic organic functional group in at least a region of an inner circumferential surface of the connection hole, the region having the pre-treated surface 6 (modified layer formation step), a step of forming a via-hole 5 by forming an underlying conductor layer 8 and a main conductor layer 9 so as to be in contact with the inner circumferential surface of the connection hole on which the modified layer 7 is formed (inner circumferential surface of the modified layer 7) (via-hole formation step), and a step of forming a conductive pattern by etching the first conductive layer 3 and the second conductive layer 4 (conductive pattern formation step).

<Layered Product Preparation Step>

Figure 2A:
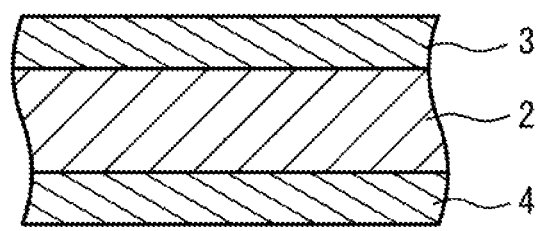
FIG. 2A is a schematic partial sectional view illustrating a step of producing the printed wiring board in FIG. 1.

In the layered product preparation step, as illustrated in FIG. 2A, a layered product including a base layer 2, a first conductive layer 3, and a second conductive layer 4 is prepared.

Examples of a method for stacking, on the base layer 2, a conductive material for forming the first conductive layer 3 and the second conductive layer 4 include a method in which a metal foil is bonded with an adhesive or the like, and a method in which a metal is deposited by vapor deposition.

<Connection Hole Formation Step>

Figure 2B:
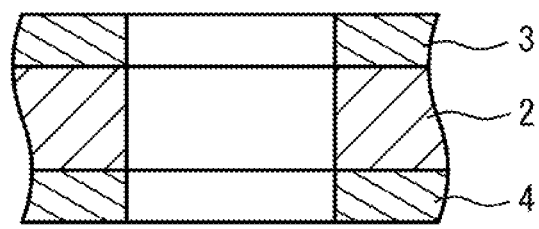
FIG. 2B is a schematic partial sectional view illustrating a step of producing the printed wiring board in FIG. 1, the step being performed subsequent to the step illustrated in FIG. 2A.

In the connection hole formation step, as illustrated in FIG. 2B, a connection hole penetrating the base layer 2, the first conductive layer 3, and the second conductive layer 4 is formed in the layered product.

Examples of the method for forming such a connection hole include known methods such as punching, laser processing, and drilling.

<Pre-Treated Surface Formation Step>

Figure 2C:
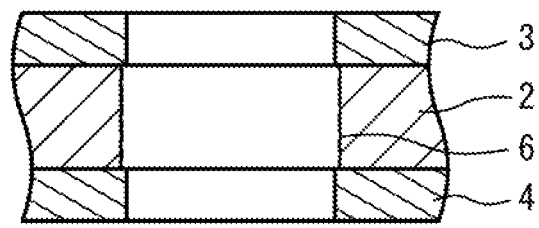
FIG. 2C is a schematic partial sectional view illustrating a step of producing the printed wiring board in FIG. 1, the step being performed subsequent to the step illustrated in FIG. 2B.

In the pre-treated surface formation step, by subjecting at least an end face (inner circumferential surface of the connection hole) of the base layer 2 to a surface treatment, as illustrated in FIG. 2C, a pre-treated surface 6 containing oxygen atoms or nitrogen atoms is formed on the end face of the base layer 2.

Examples of the surface treatment include Na etching, an alkali treatment, a plasma treatment, and radiation exposure. In such a surface treatment, molecules of the end face of the base layer 2 are finely cut or removed (etched), and oxygen atoms or nitrogen atoms can be thereby added.

The Na etching is a treatment in which a surface layer of a fluororesin of an end face of the base layer 2 is etched by immersing the base layer 2 in an etchant containing metallic Na, for example, "TETRA-ETCH" manufactured by Junkosha Inc.

The alkali treatment is a treatment in which a surface layer of a fluororesin of an end face of the base layer 2 is etched by immersing the base layer 2 in a liquid containing a strong alkali such as potassium hydroxide.

The plasma treatment is a treatment in which a surface layer of a fluororesin of an end face of the base layer 2 is etched by bringing the base layer 2 into contact with plasma. In an atmospheric-pressure plasma treatment, which is an example of this plasma treatment, plasma gas such as oxygen, nitrogen, hydrogen, argon, or ammonia is injected onto the end face of the base layer 2. Alternatively, the entire surface of the layered product including the base layer 2, the first conductive layer 3, and the second conductive layer 4 may be subjected to a plasma treatment by placing the layered product in a plasma gas atmosphere. The plasma treatment may be performed by using plasma of an inert gas containing a compound having a hydrophilic group.

The radiation exposure is a treatment in which oxygen atoms or nitrogen atoms are added in place of fluorine atoms by irradiating an end face of the base layer 2 with high-energy radiation to extract fluorine atoms of a fluororesin of the end face of the base layer 2. Examples of the radiation to be applied to the base layer 2 include electron beams and electromagnetic waves.

<Modified Layer Formation Step>

Figure 2D:
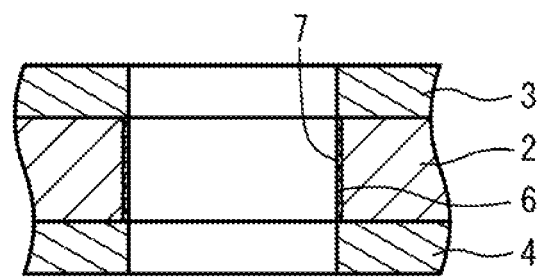
FIG. 2D is a schematic partial sectional view illustrating a step of producing the printed wiring board in FIG. 1, the step being performed subsequent to the step illustrated in FIG. 2C.

In the modified layer formation step, a coupling agent having a hydrophilic organic functional group and capable of bonding to a fluororesin is applied to at least a region of the inner circumferential surface of the connection hole, the region having the pre-treated surface 6, to form a modified layer 7 that is in contact with the pre-treated surface 6, as illustrated in FIG. 2D. Specifically, this modified layer 7 is formed by bonding the coupling agent to the fluororesin of the base layer 2. The chemical bonds between the fluororesin of the base layer 2 and the coupling agent may include covalent bonds alone or covalent bonds and hydrogen bonds.

(Coupling Agent)

Examples of the coupling agent having a hydrophilic organic functional group and capable of bonding to a fluororesin include silane coupling agents and titanium coupling agents. In particular, silane coupling agents that form a siloxane bond (Si—O—Si) are suitable. Furthermore, silane coupling agents having a hydrolyzable functional group containing a Si atom are more suitable. Specifically, the preferable modified layer 7 contains a siloxane bond.

In the modified layer 7 formed by using a silane coupling agent, the hydrophilic organic functional group is bonded to a Si atom, which is a constituent element of a siloxane bond, either directly or with one or a plurality of C atoms (for example, a methylene group or a phenylene group) therebetween.

In the modified layer 7, a Si atom that forms a siloxane bond (this atom is hereinafter referred to as "Si atom of a siloxane bond") is covalently bonded to a C atom of the base layer 2 with at least one atom of a N atom, a C atom, an O atom, and a S atom therebetween. For example, the Si atom of a siloxane bond is boded to a C atom of a fluororesin with an atomic group such as —O—, —S—, —S—S—, —(CH$_2$)$_n$—, —NH—, —(CH$_2$)$_n$—NH—, or —(CH$_2$)$_n$—O—(CH$_2$)$_m$— (where n and m are each an integer of 1 or more) therebetween.

The hydrolyzable functional group containing a Si atom is specifically a group in which an alkoxy group is bonded to a Si atom. Example of the alkoxy group include a methoxy group, an ethoxy group, a propoxy group, t-butoxy group, and a pentyloxy group.

Examples of the hydrophilic organic functional group containing a N atom include an amino group and a ureido group.

Examples of the silane coupling agent having a hydrophilic organic functional group containing a N atom include aminoalkoxysilanes, ureidoalkoxysilanes, and derivatives thereof.

Examples of the aminoalkoxysilanes include 3-aminopropyltrimethoxysilane, 3-aminopropyltriethoxysilane, N-(2-aminoethyl)-3-aminopropylmethyldimethoxysilane, N-(2-aminoethyl)-3-aminopropyltrimethoxysilane, N-(2-aminoethyl)-3-aminopropyltriethoxysilane, and N-phenyl-3-aminopropyltrimethoxysilane.

Examples of the derivatives of aminoalkoxysilanes include ketimines such as 3-triethoxysilyl-N-(1,3-dimethyl-butylidene)propylamine, and salts of a silane coupling agent, such as acetate of N-vinylbenzyl-2-aminoethyl-3-aminopropyltrimethoxysilane.

Examples of the ureidoalkoxysilanes include 3-ureidopropyltriethoxysilane, 3-ureidopropyltrimethoxysilane, and N-(2-ureidoethyl)-3-aminopropyltrimethoxysilane.

Examples of the hydrophilic organic functional group containing a S atom include a mercapto group and a sulfide group.

Examples of the silane coupling agent having a hydrophilic organic functional group containing a S atom include mercaptoalkoxysilanes, sulfide alkoxysilanes, and derivatives thereof.

Examples of the mercaptoalkoxysilanes include 3-mercaptopropyltrimethoxysilane, 3-mercaptopropyltriethoxysilane, and 3-mercaptopropyl(dimethoxy)methylsilane.

Examples of the sulfide alkoxysilanes include bis(3-triethoxysilylpropyl)tetrasulfide and bis(3-triethoxysilylpropyl)disulfide.

The silane coupling agent may be a silane coupling agent to which a modifying group is introduced. The modifying group is preferably a phenyl group.

Among the silane coupling agents exemplified above, 3-aminopropyltriethoxysilane, N-phenyl-3-aminopropyltrimethoxysilane, 3-ureidopropyltriethoxysilane, 3-mercaptopropyltrimethoxysilane, or bis(3-triethoxysilylpropyl)tetrasulfide is preferable.

Examples of the titanium coupling agents for forming the modified layer 7 include isopropyltriisostearoyl titanate, isopropyltristearoyl titanate, isopropyltrioctanoyl titanate, isopropyldimethacrylisostearoyl titanate, isopropyltridodecylbenzenesulfonyl titanate, isopropylisostearoyldiacryl titanate, isopropyltri(dioctylphosphate) titanate, isopropyltricumylphenyl titanate, isopropyltris(dioctylpyrophosphate) titanate, isopropyltri(N-aminoethyl-aminoethyl) titanate, tetraisopropylbis(dioctylphosphite) titanate, tetraoctylbis(ditridecylphosphite) titanate, tetra(2,2-diallyloxymethyl-1-butyl)bis(ditridecylphosphite) titanate, dicumylphenyloxyacetate titanate, bis(dioctylpyrophosphate)oxyacetate titanate, diisostearoylethylene titanate, bis(dioctylpyrophosphate)ethylene titanate, bis(dioctylpyrophosphate)diisopropyl titanate, tetramethyl orthotitanate, tetraethyl orthotitanate, tetrapropyl orthotitanate, tetraisopropyltetraethyl orthotitanate, tetrabutyl orthotitanate, butylpolytitanate, tetraisobutyl orthotitanate, 2-ethylhexyl titanate, stearyl titanate, cresyl titanate monomer, cresyl titanate polymer, diisopropoxy-bis(2,4-pentadionate)titanium (IV), diisopropyl-bis(triethanolamino) titanate, octylene glycol titanate, titanium lactate, acetoacetic ester titanate, diisopropoxy bis(acetylacetonato)titanium, di-n-butoxy bis(triethanolaminato)titanium, dihydroxybis(lactato)titanium, titanium-isopropoxyoctylene glycolate, tetra-n-butoxytitanium polymer, tri-n-butoxytitanium monostearate polymer, butyl titanate dimer, titanium acetylacetonate, poly(titanium acetylacetonate), titanium octylene glycolate, titanium lactate ammonium salt, titanium lactate ethyl ester, titanium triethanol aminate, and polyhydroxytitanium stearate.

<Via-Hole Formation Step>

The via-hole formation step includes a step of forming an underlying conductor layer 8 so as to be in contact with an inner circumferential surface of the modified layer 7, and an end face and an outer surface of the first conductive layer 3, and an end face and an outer surface of the second conductive layer 4 (underlying conductor layer formation step) and a step of forming a main conductor layer 9 so as to be in contact with the surface of the underlying conductor layer 8 (main conductor layer formation step).

(Underlying Conductor Layer Formation Step)

Figure 2E:
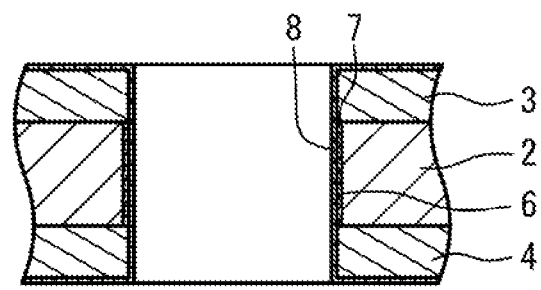
FIG. 2E is a schematic partial sectional view illustrating a step of producing the printed wiring board in FIG. 1, the step being performed subsequent to the step illustrated in FIG. 2D.

In the underlying conductor layer formation step, as illustrated in FIG. 2E, an underlying conductor layer 8 that is in contact with an inner circumferential surface of the modified layer 7, and an end face and an outer surface of the first conductive layer 3, and an end face and an outer surface of the second conductive layer 4 is formed by electroless plating. Electroless plating is a process for depositing a metal having a catalytic activity by a reducing action of a catalyst. Commercially available electroless plating solutions can be used for the electroless plating. Since the underlying conductor layer 8 is formed by electroless plating, the underlying conductor layer 8 can be easily formed, and the main conductor layer 9 can be further formed reliably.

(Main Conductor Layer Formation Step)

In the main conductor layer formation step, a metal is deposited by electroplating on the underlying conductor layer 8 serving as an adherend to form a main conductor layer 9 that is in contact with an inner circumferential surface of the underlying conductor layer 8. Thus, the via-hole 5 of the printed wiring board 1 illustrated in FIG. 1 is formed.

<Conductive Pattern Formation Step>

In a conductive pattern formation step, the first conductive layer 3 and the second conductive layer 4 are etched by, for example, a known etching method in which a resist pattern is formed by photolithography to form a conductive pattern.

[Advantages]

According to the printed wiring board 1, the base layer 2 includes the pre-treated surface 6 on an end face formed by the connection hole, the pre-treated surface 6 containing oxygen atoms or nitrogen atoms in an amount of 0.2 atomic percent or more. Accordingly, since the base layer 2 has hydrophilicity and improved wettability with a liquid, a surface chemical reaction in a liquid treatment step, such as plating for forming the underlying conductor layer 8, is accelerated. This structure provides high adhesiveness of the underlying conductor layer 8, and furthermore, the via-hole 5 to the end face of the base layer 2. Since the modified layer 7 having a hydrophilic organic functional group is formed on the pre-treated surface 6, the adhesiveness is further improved. Consequently, the printed wiring board 1 has highly reliable electrical connection between the first conductive layer 3 and the second conductive layer 4.

Due to the high adhesiveness of the underlying conductor layer 8 to the end face of the base layer 2, the main conductor layer 9 having a low electrical resistance can be formed by electroplating to form the via-hole 5 easily and reliably. Therefore, the printed wiring board 1 can be provided at a relatively low cost.

According to the printed wiring board 1, the modified layer 7 is formed by using a silane coupling agent. Therefore, the hydrophilic organic functional group that increases the adhesiveness of the via-hole 5 and the fluororesin of the base layer 2 can be efficiently bonded to each other with a siloxane bond, which contains silicon as a skeleton, therebetween. With this structure, the printed wiring board 1 has good productivity and good reliability.

According to the printed wiring board 1, since the pre-treated surface 6 is formed on the end face of the base layer 2, the coupling agent is reliably bonded to the end face of the base layer 2. Therefore, the modified layer 7 is easily formed on the end face of the base layer 2 to further improve the efficiency of the formation of the via-hole 5 and reliability of the printed wiring board.

Second Embodiment

Figure 3:
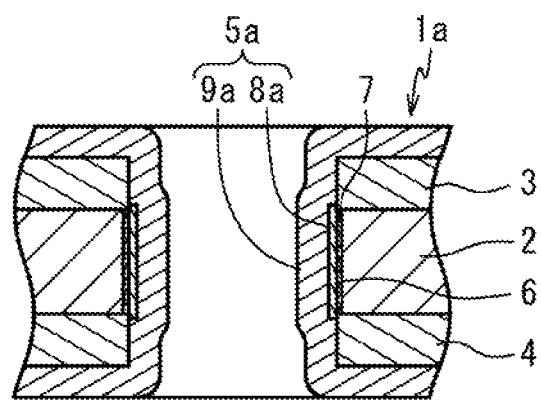
FIG. 3 is a schematic partial sectional view illustrating a printed wiring board according to an embodiment different from the embodiment illustrated in FIG. 1.

A printed wiring board 1a illustrated in FIG. 3 includes a base layer 2 containing a fluororesin as a main component, a first conductive layer 3 stacked on one surface of the base layer 2, a second conductive layer 4 stacked on the other surface of the base layer 2, and a via-hole 5a that is formed along a connection hole penetrating the base layer 2, the first conductive layer 3, and the second conductive layer 4 in a thickness direction and that electrically connects the first conductive layer 3 and the second conductive layer 4 to each other. The base layer 2 includes a pre-treated surface 6 having a content ratio of oxygen atoms or nitrogen atoms of 0.2 atomic percent or more on an inner circumferential surface of the base layer 2 in the connection hole. The printed wiring board 1a further includes a modified layer 7 that is formed on the inner circumferential surface of the connection hole so as to be in contact with the pre-treated surface 6 and that has a hydrophilic organic functional group.

The base layer 2, the first conductive layer 3, the second conductive layer 4, the pre-treated surface 6, and the modified layer 7 of the printed wiring board 1a in FIG. 3 are respectively the same as the base layer 2, the first conductive layer 3, the second conductive layer 4, the pre-treated surface 6, and the modified layer 7 of the printed wiring board 1 in FIG. 1 and thus are assigned the same reference numerals, and an overlapping description thereof is omitted.
<Via-Hole>

The via-hole 5a of the printed wiring board 1a includes an underlying conductor layer 8a and a main conductor layer 9a. The underlying conductor layer 8a is formed so as to be in contact with an inner circumferential surface of the connection hole, the inner circumferential surface having the modified layer 7 thereon (inner circumferential surface of the modified layer 7). The main conductor layer 9a is formed on the inner circumferential surface of the underlying conductor layer 8a, end faces of the first conductive layer 3 and the second conductive layer 4 in the connection hole (inner circumferential surface of the connection hole), a region of the outer surface of the first conductive layer 3, the region being located near the connection hole (surface on the opposite side of the base layer 2), and a region of the outer surface of the second conductive layer 4, the region being located near the connection hole (surface on the opposite side of the base layer 2).
(Underlying Conductor Layer)

The underlying conductor layer 8a of the printed wiring board 1a in FIG. 3 is a thin layer formed by adhering a conductive material and is used as an adherend when the main conductor layer 9a is formed. This underlying conductor layer 8a can be formed by using a commercially available processing agent.

Examples of the conductive material that forms the underlying conductor layer 8a include conductive fine particles formed of, for example, carbon or a metal. Among these, carbon fine particles and palladium fine particles are suitable. Adhesion of the conductive material may be performed by, for example, applying a fine particle dispersion liquid in which conductive fine particles are dispersed in a liquid.

The lower limit of the average thickness of the underlying conductor layer 8a is preferably 0.01 μm, and more preferably 0.1 μm. The upper limit of the average thickness of the underlying conductor layer 8a is preferably 0.5 and more preferably 0.2 When the average thickness of the underlying conductor layer 8a is less than the lower limit, continuity of the underlying conductor layer 8a cannot be ensured, and the main conductor layer 9a may not be uniformly formed. When the average thickness of the underlying conductor layer 8a exceeds the upper limit, the via-hole 5a has a large diameter, and thus the degree of integration of the printed wiring board may decrease.
(Main Conductor Layer)

The main conductor layer 9a of the printed wiring board 1a in FIG. 3 is formed of a metal deposited by electroplating on the inner circumferential surface of the underlying conductor layer 8a, end faces of the first conductive layer 3 and the second conductive layer 4 in the connection hole, a region of the outer surface of the first conductive layer 3, the region being located near the connection hole, and a region of the outer surface of the second conductive layer 4, the region being located near the connection hole. The metal that forms the main conductor layer 9a of the printed wiring board 1a in FIG. 3 and the thickness of the main conductor layer 9a are the same as those of the main conductor layer 9 of the printed wiring board 1 in FIG. 1.
[Method for Producing Printed Wiring Board]

A method for producing the printed wiring board 1a includes a step of preparing a layered product including a base layer 2, a first conductive layer 3, and a second conductive layer 4 (layered product preparation step), a step of forming a connection hole in the layered product (connection hole formation step), a step of forming a pre-treated surface 6 having a content ratio of oxygen atoms or nitrogen atoms of 0.2 atomic percent or more on an inner circumferential surface of the base layer in the formed connection hole (pre-treated surface formation step), a step of forming a modified layer 7 having a hydrophilic organic functional group on an inner circumferential surface of the connection hole, the inner circumferential surface having the pre-treated surface 6 thereon (modified layer formation step), a step of forming a via-hole 5a by forming an underlying conductor layer 8a and a main conductor layer 9a so as to be in contact with the inner circumferential surface of the connection hole on which the modified layer 7 is formed (via-hole formation step), and a step of forming a conductive pattern by etching the first conductive layer 3 and the second conductive layer 4 (conductive pattern formation step).

The layered product preparation step, the connection hole formation step, the pre-treated surface formation step, and the modified layer formation step in the method for producing the printed wiring board 1a are the same as the layered product preparation step, the connection hole formation step, the pre-treated surface formation step, and the modified layer formation step in the method for producing the printed wiring board 1 in FIG. 1. Accordingly, an overlapping description is omitted.

<Via-Hole Formation Step>

The via-hole formation step includes a step of forming an underlying conductor layer 8a that is in contact with an inner circumferential surface of the modified layer 7 (underlying conductor layer formation step) and a step of forming a main conductor layer 9a that is in contact with an inner circumferential surface of the underlying conductor layer 8 a, an end face of the first conductive layer 3 in the connection hole, a region of the outer surface of the first conductive layer 3, the region being located near the connection hole, an end face of the second conductive layer 4 in the connection hole, and a region of the outer surface of the second conductive layer 4, the region being located near the connection hole (main conductor layer formation step).

(Underlying Conductor Layer Formation Step)

Figure 4A:
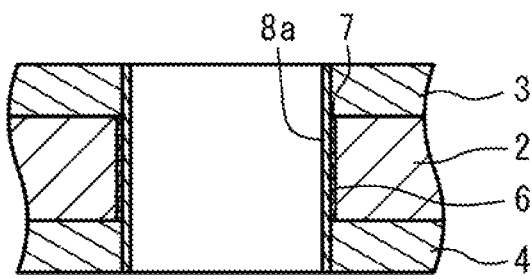
FIG. 4A is a schematic partial sectional view illustrating a step of producing the printed wiring board in FIG. 3.

In the underlying conductor layer formation step, first, as illustrated in FIG. 4A, the surface potential of the inner circumferential surface of the connection hole formed in the layered product including the base layer 2, the first conductive layer 3, and the second conductive layer 4 is adjusted with a conditioner. Colloidal conductive fine particles are applied and adsorbed onto the inner circumferential surface of the connection hole to form an underlying conductor layer 8a. This formation of the underlying conductor layer 8a by application of conductive fine particles can be performed by using, for example, a "Blackhole System" manufactured by Nippon MacDermid Co., Ltd.

Figure 4B:
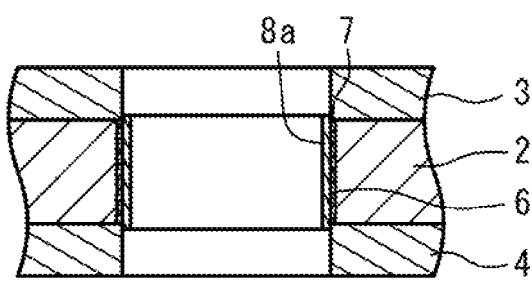
FIG. 4B is a schematic partial sectional view illustrating a step of producing the printed wiring board in FIG. 3, the step being performed subsequent to the step illustrated in FIG. 4A.

Subsequently, as illustrated in FIG. 4B, two end portions of the underlying conductor layer 8a in the thickness direction of the base layer 2 are removed so as to expose end faces of the first conductive layer 3 and the second conductive layer 4 (inner circumferential surfaces of the connection hole). Specifically, surface layers of the outer surfaces and end faces of the first conductive layer 3 and the second conductive layer 4 are removed by etching to separate portions of the underlying conductor layer 8a, the portions adhering to the surfaces of the first conductive layer 3 and the second conductive layer 4.

(Main Conductor Layer Formation Step)

In the main conductor layer formation step, a metal is deposited by electroplating on the underlying conductor layer 8a and regions of the first conductive layer 3 and the second conductive layer 4, the regions being located near the underlying conductor layer 8a, which serve as an adherend, to form a main conductor layer 9a. Thus, the via-hole 5a of the printed wiring board 1a illustrated in FIG. 3 is formed.

<Conductive Pattern Formation Step>

In a conductive pattern formation step, the first conductive layer 3 and the second conductive layer 4 are etched by, for example, a known etching method in which a resist pattern is formed by photolithography to form a conductive pattern.

[Advantages]

According to the method for producing the printed wiring board 1a, since portions of the underlying conductor layer 8a on the end faces of the first conductive layer 3 and the second conductive layer 4 are removed in the underlying conductor layer formation step, the main conductor layer 9a is formed directly on the end faces of the first conductive layer 3 and the second conductive layer 4. The conductivity of the underlying conductor layer 8a is lower than those of the first conductive layer 3, the second conductive layer 4, and the main conductor layer 9a, all of which are formed of a metal. Accordingly, the electrical resistance between the first conductive layer 3 and the second conductive layer 4 can be reduced by forming the main conductor layer 9a directly on the end faces of the first conductive layer 3 and the second conductive layer 4, as described above.

Third Embodiment

Figure 5:
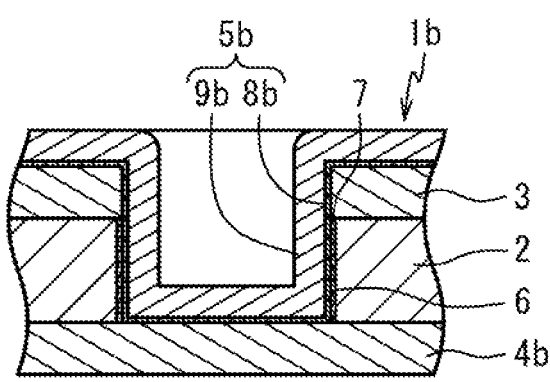
FIG. 5 is a schematic partial sectional view illustrating a printed wiring board according to an embodiment different from the embodiments illustrated in FIGS. 1 and 3.

A printed wiring board 1b illustrated in FIG. 5 includes a base layer 2 containing a fluororesin as a main component, a first conductive layer 3 stacked on one surface of the base layer 2, a second conductive layer 4b stacked on the other surface of the base layer 2, and a via-hole 5b which is formed along a connection hole that penetrates only the base layer 2 and the first conductive layer 3 and that does not penetrate the second conductive layer 4b, and which electrically connects the first conductive layer 3 and the second conductive layer 4b to each other. The base layer 2 includes a pre-treated surface 6 having a content ratio of oxygen atoms or nitrogen atoms of 0.2 atomic percent or more on an inner circumferential surface of the base layer 2 in the connection hole. The printed wiring board 1b further includes a modified layer 7 that is formed on the pre-treated surface 6 on the inner circumferential surface of the base layer 2 in the connection hole and that has a hydrophilic organic functional group.

The base layer 2, the first conductive layer 3, the pre-treated surface 6, and the modified layer 7 of the printed wiring board 1b in FIG. 5 are respectively the same as the base layer 2, the first conductive layer 3, the pre-treated surface 6, and the modified layer 7 of the printed wiring board 1 in FIG. 1 and thus are assigned the same reference numerals, and an overlapping description thereof is omitted.

<Conductive Layer>

In the printed wiring board 1b in FIG. 5, the connection hole does not penetrate the second conductive layer 4b to expose an inner surface of the second conductive layer 4b (surface on the side on which the base layer 2 is stacked). The structure of the second conductive layer 4b of the printed wiring board 1b in FIG. 5 is the same as the structure of the second conductive layer 4 of the printed wiring board 1 in FIG. 1 except for this point, and thus an overlapping description is omitted.

<Via-Hole>

The via-hole 5b of the printed wiring board 1b in FIG. 5 includes an underlying conductor layer 8b and a main conductor layer 9b. The underlying conductor layer 8b is formed so as to be in contact with an inner circumferential surface of the modified layer 7, an end face of the first conductive layer 3 in the connection hole, a region of the outer surface of the first conductive layer 3, the region being located near the connection hole, and an inner surface (surface on the base layer 2 side) of the second conductive layer 4b in the connection hole. The main conductor layer 9b is formed so as to be in contact with the underlying conductor layer 8b.

[Method for Producing Printed Wiring Board]

A method for producing the printed wiring board 1b includes a step of preparing a layered product including a base layer 2, a first conductive layer 3, and a second conductive layer 4b (layered product preparation step), a step of forming a connection hole in the layered product (connection hole formation step), a step of forming a pre-treated surface 6 having a content ratio of oxygen atoms or nitrogen atoms of 0.2 atomic percent or more on an inner circumferential surface of the base layer in the formed connection hole (pre-treated surface formation step), a step of forming a modified layer 7 having a hydrophilic organic functional group on an inner circumferential surface of the connection hole, the inner circumferential surface having the pre-treated surface 6 thereon (modified layer formation step), a step of forming a via-hole 5b by forming an underlying conductor layer 8b and a main conductor layer 9b so as to be in contact with the inner circumferential surface of the connection hole on which the modified layer 7 is formed (via-hole formation step), and a step of forming a conductive pattern by etching the first conductive layer 3 and the second conductive layer 4 (conductive pattern formation step).

<Layered Product Preparation Step>

The layered product preparation step in the method for producing the printed wiring board 1b is the same as the layered product preparation step in the method for producing the printed wiring board 1 in FIG. 1, and thus an overlapping description is omitted.

<Connection Hole Formation Step>

Figure 6A:
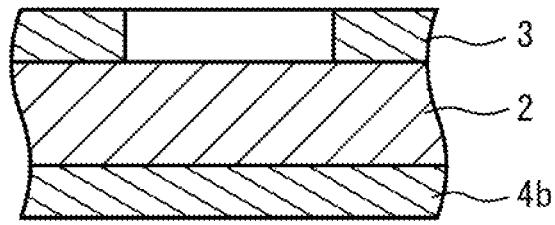
FIG. 6A is a schematic partial sectional view illustrating a step of producing the printed wiring board in FIG. 5.

In the connection hole formation step, first, an opening is formed in the first conductive layer 3, as illustrated in FIG. 6A. The opening of the first conductive layer 3 may be formed by, for example, forming a resist pattern on the first conductive layer 3 and performing etching.

Figure 6B:
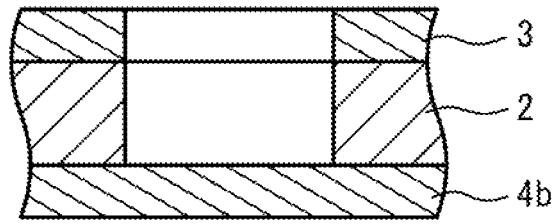
FIG. 6B is a schematic partial sectional view illustrating a step of producing the printed wiring board in FIG. 5, the step being performed subsequent to the step illustrated in FIG. 6A.

Subsequently, as illustrated in FIG. 6B, the material of the base layer 2 on the lower side of the opening formed in the first conductive layer 3 is removed to form a connection hole. The material of the base layer 2 may be removed by, for example, a laser processing.

<Pre-Treated Surface Formation Step>

Figure 6C:
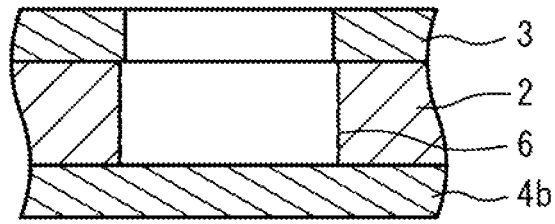
FIG. 6C is a schematic partial sectional view illustrating a step of producing the printed wiring board in FIG. 5, the step being performed subsequent to the step illustrated in FIG. 6B.

In the pre-treated surface formation step, as illustrated in FIG. 6C, a pre-treated surface 6 is formed on at least an end face (inner circumferential surface of the connection hole) of the base layer 2. The method for forming the pre-treated surface 6 is the same as the method for forming the pre-treated surface 6 in the pre-treated surface formation step in FIG. 2C, and thus an overlapping description is omitted.

<Modified Layer Formation Step>

Figure 6D:
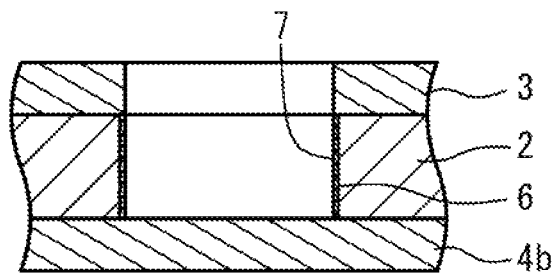
FIG. 6D is a schematic partial sectional view illustrating a step of producing the printed wiring board in FIG. 5, the step being performed subsequent to the step illustrated in FIG. 6C.

In the modified layer formation step, as illustrated in FIG. 6D, a coupling agent having a hydrophilic organic functional group and capable of bonding to a fluororesin is applied to the end face of the base layer 2 to form a modified layer 7 that is in contact with the pre-treated surface 6. The method for forming the modified layer 7 and the type of the coupling agent used are the same as those in the modified layer formation step in FIG. 2D, and thus an overlapping description is omitted.

<Via-Hole Formation Step>

The via-hole formation step includes a step of forming an underlying conductor layer 8b so as to be in contact with an inner circumferential surface of the modified layer 7, the end face of the first conductive layer 3 in the connection hole, a region of the outer surface of the first conductive layer 3, the region being located near the connection hole, and the inner surface of the second conductive layer 4b in the connection hole (underlying conductor layer formation step) and a step of forming a main conductor layer 9b so as to be in contact with the surface of the underlying conductor layer 8b (main conductor layer formation step).

(Underlying Conductor Layer Formation Step)

Figure 6E:
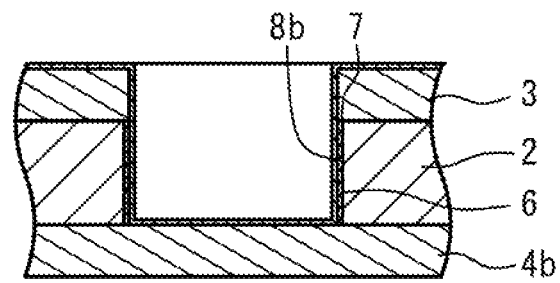
FIG. 6E is a schematic partial sectional view illustrating a step of producing the printed wiring board in FIG. 5, the step being performed subsequent to the step illustrated in FIG. 6D.

In the underlying conductor layer formation step, as illustrated in FIG. 6E, an underlying conductor layer 8b is formed by electroless plating on an inner circumferential surface of the modified layer 7, the end face of the first conductive layer 3 in the connection hole, a region of the outer surface of the first conductive layer 3, the region being located near the connection hole, and the inner surface of the second conductive layer 4b in the connection hole. The electroless plating for forming the underlying conductor layer 8b may be performed as in the electroless plating for forming the underlying conductor layer 8 in FIG. 2E.

(Main Conductor Layer Formation Step)

In the main conductor layer formation step, a metal is deposited by electroplating on the underlying conductor layer 8b serving as an adherend to form a main conductor layer 9b. Thus, the via-hole 5b of the printed wiring board 1b illustrated in FIG. 5 is formed.

The electroplating in this main conductor layer formation step may be performed as in the electroplating for forming the main conductor layer 9 of the printed wiring board 1 in FIG. 1.

<Conductive Pattern Formation Step>

In a conductive pattern formation step, the first conductive layer 3 and the second conductive layer 4b are etched by, for example, a known etching method in which a resist pattern is formed by photolithography to form a conductive pattern.

[Advantages]

According to the printed wiring board 1b, since an end of the via-hole 5b is not formed on an outer surface of the second conductive layer 4b, the printed wiring board 1b is easily stacked on another printed wiring board and is suitable for forming a multilayer substrate.

Fourth Embodiment

Figure 7:
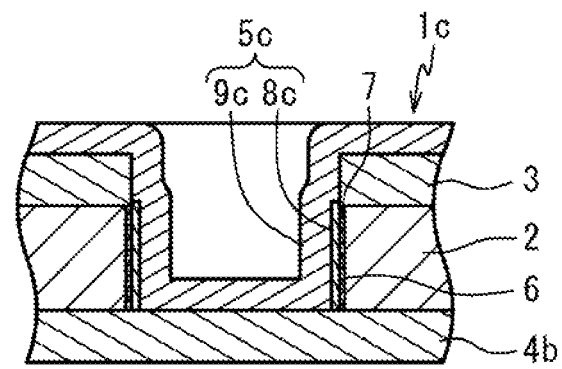
FIG. 7 is a schematic partial sectional view illustrating a printed wiring board according to an embodiment different from the embodiments illustrated in FIGS. 1, 3, and 5.

A printed wiring board 1c illustrated in FIG. 7 includes a base layer 2 containing a fluororesin as a main component, a first conductive layer 3 stacked on one surface of the base layer 2, a second conductive layer 4b stacked on the other surface of the base layer 2, and a via-hole 5c which is formed along a connection hole penetrating the base layer 2 and the first conductive layer 3 and which electrically connects the first conductive layer 3 and the second conductive layer 4b to each other. The base layer 2 includes a pre-treated surface 6 having a content ratio of oxygen atoms or nitrogen atoms of 0.2 atomic percent or more on an inner circumferential surface of the base layer 2 in the connection hole. The printed wiring board 1c further includes a modified layer 7 formed on the pre-treated surface 6, that is, on an inner circumferential surface of the base layer 2 in the connection hole and having a hydrophilic organic functional group.

The base layer 2, the first conductive layer 3, the second conductive layer 4b, the pre-treated surface 6, and the modified layer 7 of the printed wiring board 1c in FIG. 7 are respectively the same as the base layer 2, the first conductive layer 3, the second conductive layer 4b, the pre-treated surface 6, and the modified layer 7 of the printed wiring board 1b in FIG. 5 and thus are assigned the same reference numerals, and an overlapping description thereof is omitted.

<Via-Hole>

The via-hole 5c of the printed wiring board 1c in FIG. 7 includes an underlying conductor layer 8c and a main conductor layer 9c. The underlying conductor layer 8c is formed so as to be in contact with an inner circumferential surface of the modified layer 7. The main conductor layer 9c is formed so as to be in contact with an inner circumferential surface of the underlying conductor layer 8c, an end face of the first conductive layer 3 in the connection hole, a region of the outer surface of the first conductive layer 3, the region being located near the connection hole, and an inner surface of the second conductive layer 4b in the connection hole.

(Underlying Conductor Layer)

The underlying conductor layer 8c of the printed wiring board 1c in FIG. 7 is a thin layer formed by binding conductive fine particles with a binder and is used as an adherend when the main conductor layer 9c is formed. This underlying conductor layer 8c is formed in an area where the underlying conductor layer 8c is connected to the first conductive layer 3 or the second conductive layer 4b. For example, the material and the thickness of the underlying conductor layer 8c may be the same as those of the underlying conductor layer 8a in the via-hole 5a of the printed wiring board 1a in FIG. 3.

(Main Conductor Layer)

The main conductor layer 9c of the printed wiring board 1c in FIG. 7 is formed of a metal deposited by electroplating on the inner circumferential surface of the underlying conductor layer 8c, an end face of the first conductive layer 3 in the connection hole, a region of the outer surface of the first conductive layer 3, the region being located near the connection hole, and an inner surface of the second conductive layer 4b in the connection hole. The metal that forms the main conductor layer 9c and the thickness of the main conductor layer 9c are the same as those of the main conductor layer 9 of the printed wiring board 1 in FIG. 1.

[Method for Producing Printed Wiring Board]

A method for producing the printed wiring board 1c includes a step of preparing a layered product including a base layer 2, a first conductive layer 3, and a second conductive layer 4b (layered product preparation step), a step of forming a connection hole in the layered product (connection hole formation step), a step of forming a pre-treated surface 6 having a content ratio of oxygen atoms or nitrogen atoms of 0.2 atomic percent or more on an inner circumferential surface of the base layer in the formed connection hole (pre-treated surface formation step), a step of forming a modified layer 7 having a hydrophilic organic functional group on an inner circumferential surface of the connection hole, the inner circumferential surface having the pre-treated surface 6 thereon (modified layer formation step), a step of forming a via-hole 5c by forming an underlying conductor layer 8c and a main conductor layer 9c so as to be in contact with the inner circumferential surface of the connection hole on which the modified layer 7 is formed (via-hole formation step) and a step of forming a conductive pattern by etching the first conductive layer 3 and second conductive layer 4b, for example, with a known etching method in which a resist pattern is formed by photolithography.

The layered product preparation step, the connection hole formation step, the pre-treated surface formation step, and the modified layer formation step in the method for producing the printed wiring board 1c are the same as the layered product preparation step, the connection hole formation step, the pre-treated surface formation step, and the modified layer formation step in the method for producing the printed wiring board 1b in FIG. 5. Accordingly, an overlapping description is omitted.

<Via-Hole Formation Step>

The via-hole formation step includes a step of forming an underlying conductor layer 8c so as to be in contact with an inner circumferential surface of the modified layer 7 (underlying conductor layer formation step) and a step of forming a main conductor layer 9c so as to be in contact with an inner circumferential surface of the underlying conductor layer 8c, an end face of the first conductive layer 3 in the connection hole, a region of the outer surface of the first conductive layer 3, the region being located near the connection hole, and an inner surface of the second conductive layer 4b in the connection hole (main conductor layer formation step).

(Underlying Conductor Layer Formation Step)

In the underlying conductor layer formation step, first, the surface potential of the inner circumferential surface of the connection hole formed in the layered product including the base layer 2, the first conductive layer 3, and the second conductive layer 4b is adjusted with a conditioner. Colloidal conductive fine particles are adsorbed on the inner circumferential surface of the connection hole.

Subsequently, an end face of the first conductive layer 3 (inner circumferential surface of the connection hole) and an inner surface of the second conductive layer 4b are exposed. Specifically, surface layers of the first conductive layer 3 and the second conductive layer 4b are removed by etching to separate portions of an underlying conductor layer 8c, the portions adhering to the surfaces of the first conductive layer 3 and the second conductive layer 4b.

(Main Conductor Layer Formation Step)

In the main conductor layer formation step, a metal is deposited by electroplating on the underlying conductor layer 8c and regions of the first conductive layer 3 and the second conductive layer 4b, the regions being located near the underlying conductor layer 8c, which serve as an adherend, to form a main conductor layer 9c. Thus, the via-hole 5c of the printed wiring board 1c illustrated in FIG. 7 is formed.

<Conductive Pattern Formation Step>

In a conductive pattern formation step, the first conductive layer 3 and the second conductive layer 4b are etched by, for example, a known etching method in which a resist pattern is formed by photolithography to form a conductive pattern.

Fifth Embodiment

Figure 8:
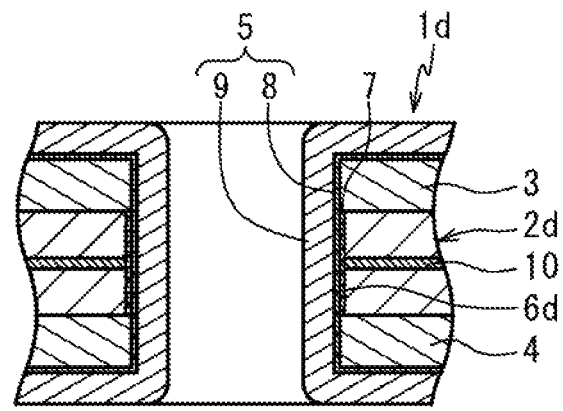
FIG. 8 is a schematic partial sectional view illustrating a printed wiring board according to an embodiment different from the embodiments illustrated in FIGS. 1, 3, 5, and 7.

A printed wiring board 1d illustrated in FIG. 8 mainly includes a base layer 2d containing a fluororesin as a main component and including a reinforcing member 10, a first conductive layer 3 stacked on one surface of the base layer 2d, a second conductive layer 4 stacked on the other surface of the base layer 2d, and a via-hole 5 that is formed along a connection hole penetrating the base layer 2d, the first conductive layer 3, and the second conductive layer 4 in a thickness direction and that electrically connects the first conductive layer 3 and the second conductive layer 4 to each other. The base layer 2d includes a pre-treated surface 6d having a content ratio of oxygen atoms or nitrogen atoms of 0.2 atomic percent or more on an inner circumferential surface of the base layer 2d in the connection hole. The printed wiring board 1d further includes a modified layer 7 that is formed in a region of the inner circumferential surface of the connection hole, the region having the pre-treated surface 6d, and that has a hydrophilic organic functional group.

The first conductive layer 3, the second conductive layer 4, the via-hole 5, and the modified layer 7 of the printed wiring board 1d in FIG. 8 are respectively the same as the first conductive layer 3, the second conductive layer 4, the via-hole 5, and the modified layer 7 of the printed wiring board 1 in FIG. 1 and thus are assigned the same reference numerals, and an overlapping description thereof is omitted.

<Base Layer>

The base layer 2d of the printed wiring board 1d in FIG. 8 is formed of a resin composition containing a fluororesin as a main component and includes the reinforcing member 10 therein. This base layer 2d has the same structure as that of the base layer 2 of the printed wiring board 1 in FIG. 1 except that the base layer 2d includes the reinforcing member 10, and thus an overlapping description thereof is omitted.

(Reinforcing Member)

The reinforcing member 10 may be dispersed in the whole base layer 2d. However, the reinforcing member 10 is preferably arranged so as not to be exposed to a surface joined to the first conductive layer 3 or the second conductive layer 4. For example, the reinforcing member 10 is arranged in a layered manner at the center in the thickness direction of the base layer 2d.

The reinforcing member 10 is not particularly limited as long as the reinforcing member 10 has a coefficient of linear expansion lower than that of the base layer 2d. The reinforcing member 10 preferably has insulating properties, such heat resistance that the reinforcing member 10 does not melt or flow at a melting point of a fluororesin, tensile strength equal to or higher than that of a fluororesin, and corrosion resistance.

Specific examples of the reinforcing member 10 include fibrous materials such as carbon fibers, glass fibers, aramid fibers, and alumina fibers. Besides the fibrous materials, filmy materials may also be used as the reinforcing member 10.

The reinforcing member 10 formed of a fibrous material may be arranged in the base layer 2d, for example, in a state in which the fibrous material forms a textile. Alternatively, the reinforcing member 10 formed of a fibrous material may be arranged in a state of separated fibers or in the form of threads such as twisted threads so that the fibers or threads are aligned in one direction or in a plurality of directions to cover an entire surface of the base layer 2d or arranged in a dispersed manner in random directions. The resin composition that forms the base layer 2d is preferably impregnated between the fibers of the reinforcing member 10.

Examples of the textile of the fibrous material used as the reinforcing member 10 include glass cloths obtained by forming glass in the form of a cloth, fluororesin-containing glass cloths obtained by impregnating such glass cloths with a fluororesin, and resin cloths obtained by forming heat-resistant fibers formed of, for example, polytetrafluoroethylene (PTFE), polyether ether ketone (PEEK), polyimide (PI), or aramid into a cloth or a non-woven fabric. Regarding the texture of these cloths, in order to prepare a base layer 2d having a small thickness, the plain weave is preferable. In order to prepare a flexible base layer 2d, for example, the twill weave or the satin weave is preferable. Besides these textures, other known textures may be used.

Examples of the filmy materials used as the reinforcing member 10 include heat-resistant films containing, as a main component, polytetrafluoroethylene (PTFE), a liquid crystal polymer (LCP (Type I)), polyimide, polyamide imide (PAD, polybenzimidazole (PBI), polyether ether ketone, polytetrafluoroethylene, a tetrafluoroethylene-perfluoroalkyl vinyl ether copolymer (PFA), a thermosetting resin, a cross-linked resin, or the like. These filmy materials may contain the fibrous materials mentioned above.

(Pre-Treated Surface)

The pre-treated surface 6d is formed by a surface treatment on a surface (inner circumferential surface of the connection hole) of the base layer 2d and contains oxygen atoms or nitrogen atoms in the resin composition that forms the base layer 2d. The surface of the reinforcing member 10 exposed on the connection hole may have the same composition as that of the reinforcing member 10 located inside the base layer 2d or may have an increased amount of oxygen atoms or nitrogen atoms.

In a portion of the pre-treated surface 6d of the printed wiring board 1d in FIG. 8, the portion being other than the reinforcing member 10, the content ratio of oxygen atoms or nitrogen atoms, the contact angle with respect to pure water, and the wetting tension are the same as the content ratio of oxygen atoms or nitrogen atoms, the contact angle with respect to pure water, and the wetting tension of the pre-treated surface 6 of the printed wiring board 1 in FIG. 1.

[Advantages]

The printed wiring board 1d has good strength because the base layer 2d includes the reinforcing member 10.

Furthermore, in the printed wiring board 1d, when a connection hole is formed in the base layer 2d by, for example, drilling, the reinforcing member 10 generates cutting chips and the cutting chips form scratches on the inner circumferential surface of the connection hole of the base layer 2d to roughen the inner circumferential surface. Consequently, the surface area of the connection hole of the base layer 2d is increased to accelerate the formation of the pre-treated surface 6d. Specifically, roughening of the surface of the connection hole due to the presence of the reinforcing member 10 contributes to an increase in the content ratio of oxygen atoms or nitrogen atoms, the contact angle with respect to pure water, and the wetting tension of the pre-treated surface 6d and achieves highly reliable electrical connection between the first conductive layer 3 and the second conductive layer 4 through the via-hole 5.

Sixth Embodiment

Figure 9:
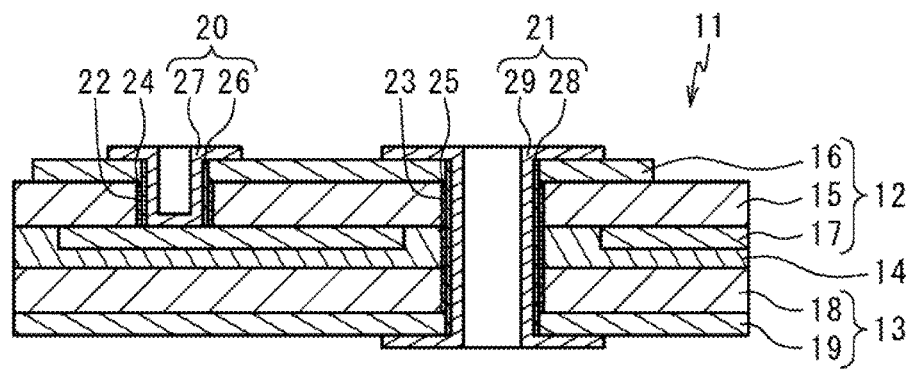
FIG. 9 is a schematic partial sectional view illustrating a printed wiring board according to an embodiment different from the embodiments illustrated in FIGS. 1, 3, 5, 7, and 8.

A printed wiring board 11 illustrated in FIG. 9 includes a first substrate 12 and a second substrate 13 stacked on the other surface side of the first substrate 12. The first substrate 12 is stacked on the second substrate 13 with an adhesive 14 therebetween.

<First Substrate>

The first substrate 12 includes a first base layer 15 containing a fluororesin as a main component, a first conductive layer 16 stacked on one surface of the first base layer 15, and a second conductive layer 17 stacked on the other surface of the first base layer 15.

<Second Substrate>

The second substrate 13 includes a second base layer 18 containing a fluororesin as a main component and a third conductive layer 19 stacked on the other surface of the second base layer 18.

<Adhesive>

The adhesive 14 is not particularly limited but preferably has good flexibility and good heat resistance. Examples of the resin used as a main component of the adhesive 14 include epoxy resins, polyimides, unsaturated polyesters, saturated polyesters, butadiene resins, acrylic resins, polyamides, polyolefins, silicones, fluororesins, urethane resins, styrene resins, butyral resins, modified polyphenylene ethers, polyether ether ketones, polyamide imides, polyether sulfones, syndiotactic polystyrenes, and resins containing at least one of these resins. Resins obtained by cross-linking any of these resins by, for example, an electron beam or a radical reaction may be used as the material of the adhesive.

The main component of the adhesive 14 is preferably a thermosetting resin. The lower limit of the curing temperature of the thermosetting resin used as a main component of the adhesive 14 is preferably 120° C. and more preferably 150° C. The upper limit of the curing temperature of the thermosetting resin used as a main component of the adhesive 14 is preferably 230° C. and more preferably 200° C. When the curing temperature of the thermosetting resin used as a main component of the adhesive 14 is less than the lower limit, an adhesive which is a raw material of the adhesive 14 may not be easily handled. On the other hand, when the curing temperature of the thermosetting resin used as a main component of the adhesive 14 exceeds the upper limit and the adhesive 14 is formed by curing an adhesive, the first base layer 15 and the second base layer 18 may be deformed by heat and the dimensional accuracy of the printed wiring board may thereby decrease.

The printed wiring board 11 includes a first via-hole 20 that is formed along a connection hole penetrating the first conductive layer 16 and the first base layer 15 in a thickness direction and that electrically connects the first conductive layer 16 and the second conductive layer 17 to each other, and a second via-hole 21 that is formed along a connection hole penetrating the first conductive layer 16, the first base layer 15, the adhesive 14, the second base layer 18, and the third conductive layer 19 in the thickness direction and that electrically connects the first conductive layer 16 and the third conductive layer 19 to each other.

The printed wiring board 11 includes a first pre-treated surface 22 formed on an inner circumferential surface of the connection hole of the first via-hole 20 of the first base layer 15, the first pre-treated surface 22 having a content ratio of oxygen atoms or nitrogen atoms of 0.2 atomic percent or more. The printed wiring board 11 includes a second pre-treated surface 23 formed on an inner circumferential surface of the connection hole of the second via-hole 21 of the first base layer 15, the adhesive 14, and the second base layer 18, the second pre-treated surface 23 having a content ratio of oxygen atoms or nitrogen atoms of 0.2 atomic percent or more.

The printed wiring board 11 includes a first modified layer 24 formed in a region where the first pre-treated surface 22 is formed and having a hydrophilic organic functional group, and a second modified layer 25 formed in a region where the second pre-treated surface 23 is formed and having a hydrophilic organic functional group.

The first base layer 15 and the second base layer 18 of the printed wiring board 11 in FIG. 9 are the same as the base layer 2 of the printed wiring board 1 in FIG. 1. The first conductive layer 16, the second conductive layer 17, and the third conductive layer 19 of the printed wiring board 11 in FIG. 9 are the same as the first conductive layer 3 and the second conductive layer 4 of the printed wiring board 1 in FIG. 1. Furthermore, the first pre-treated surface 22 and the first modified layer 24 of the printed wiring board 11 in FIG. 9 are respectively the same as the pre-treated surface 6 and the modified layer 7 of the printed wiring board 1 in FIG. 1. The second pre-treated surface 23 and the second modified layer 25 of the printed wiring board 11 in FIG. 9 are respectively the same as the pre-treated surface 6 and the modified layer 7 of the printed wiring board 1 in FIG. 1 except that the second pre-treated surface 23 and the second modified layer 25 are formed over the first base layer 15, the adhesive 14, and the second base layer 18. Therefore, an overlapping description of these components is omitted.

<First Via-Hole>

The first via-hole 20 includes a first underlying conductor layer 26 formed so as to be in contact with an inner circumferential surface of the first modified layer 24 and an end face of the first conductive layer 16 in the connection hole (inner circumferential surface of the connection hole), and a first main conductor layer 27 formed over an inner circumferential surface of the first underlying conductor layer 26, a surface on one side of the second conductive layer 17 exposed in the connection hole, and a region of a surface on the one side of the first conductive layer 16, the region being adjacent to the connection hole.

The structures of the first underlying conductor layer 26 and the first main conductor layer 27 of the printed wiring board 11 in FIG. 9 may be the same as those of the underlying conductor layer 8 and the main conductor layer 9 of the printed wiring board 1 in FIG. 1 except for the regions where the layers are formed. Thus, an overlapping description of these structures is omitted.

<Second Via-Hole>

The second via-hole 21 includes a second underlying conductor layer 28 formed so as to be in contact with an inner circumferential surface of the second modified layer 25, an end face of the first conductive layer 16 in the connection hole (inner circumferential surface of the connection hole), and an end face of the third conductive layer 19 in the connection hole, and a second main conductor layer 29 formed over an inner circumferential surface of the second underlying conductor layer 28, a region of a surface on the one side of the first conductive layer 16, the region being adjacent to the connection hole, and a region of a surface on the other side of the third conductive layer 19, the region being adjacent to the connection hole.

The structures of the second underlying conductor layer 28 and the second main conductor layer 29 of the printed wiring board 11 in FIG. 9 may be the same as those of the underlying conductor layer 8 and the main conductor layer 9 of the printed wiring board 1 in FIG. 1 except for the regions where the layers are formed. Thus, an overlapping description of these structures is omitted.

[Method for Producing Printed Wiring Board]

A method for producing the printed wiring board 11 includes a step of preparing a first substrate 12 and a second substrate 13 (substrate preparation step), a step of forming connection holes in the first substrate 12 and the second substrate 13 (connection hole formation step), a step of stacking the first substrate 12 and the second substrate 13 with an adhesive 14 therebetween (substrate-stacking step), a step of forming a first pre-treated surface 22 and a second pre-treated surface 23 (pre-treated surface formation step), a step of forming a first modified layer 24 and a second modified layer 25 each having a hydrophilic organic functional group so as to be in contact with inner circumferential surfaces of the connection holes (modified layer formation step), a step of forming a first underlying conductor layer 26 and a second underlying conductor layer 28 so as to be in contact with inner circumferential surfaces of the first modified layer 24 and the second modified layer 25 (underlying conductor layer formation step), a step pf forming a mask M for plating on each of a surface on one side of the first substrate 12 and a surface on the other side of the second substrate 13, the mask M having openings in regions adjacent to the connection holes (mask formation step), a step of selectively forming a first main conductor layer 27 or a second main conductor layer 29 on the first underlying conductor layer 26, the second underlying conductor layer 28, a first conductive layer 16, a second conductive layer 17, and a third conductive layer 19 in the openings of the mask M for plating (main conductor layer formation step), and a step of removing the mask M for plating (mask removal step).

<Substrate Preparation Step>

In the substrate preparation step, a first substrate 12 on which a first conductive layer 16 and a second conductive layer 17 are formed by patterning and a second substrate 13 on which a third conductive layer 19 is formed by patterning are prepared. The first substrate 12 and the second substrate 13 having such structures are known, and thus a description of the method for forming these substrates is omitted.

<Connection Hole Formation Step>

Figure 10A:
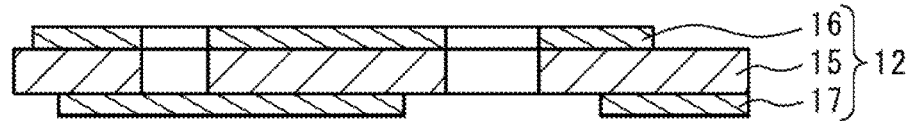
FIG. 10A is a schematic partial sectional view illustrating a step of producing the printed wiring board in FIG. 9.

In the connection hole formation step, as illustrated in FIG. 10A, connection holes are formed in the first substrate 12 and the second substrate 13. The method for forming the connection holes may be the same as the method for forming the connection hole in FIG. 2B.

<Substrate-Stacking Step>

Figure 10B:
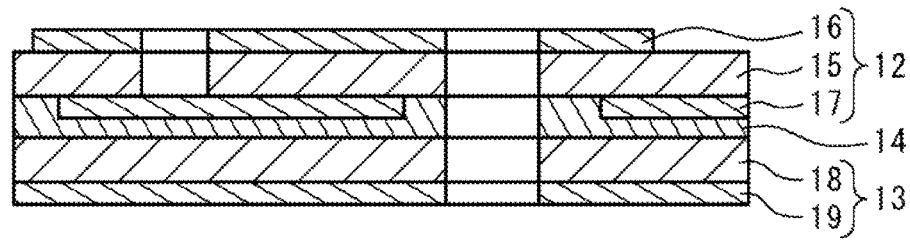
FIG. 10B is a schematic partial sectional view illustrating a step of producing the printed wiring board in FIG. 9, the step being performed subsequent to the step illustrated in FIG. 10A.

In the substrate-stacking step, as illustrated in FIG. 10B, the first substrate 12 and the second substrate 13 are stacked with an adhesive 14 therebetween. In this step, the adhesive 14 is stacked so as not to fill the connection hole of the second substrate 13. For this purpose, in the connection hole formation step, the adhesive 14 may be stacked on a surface on the other side of the first substrate 12 or a surface on the one side of the second substrate 13, and a connection hole penetrating a layer of the adhesive 14 may be formed in the first substrate 12 or second substrate 13 having the adhesive 14 thereon.

<Pre-Treated Surface Formation Step>

Figure 10C:
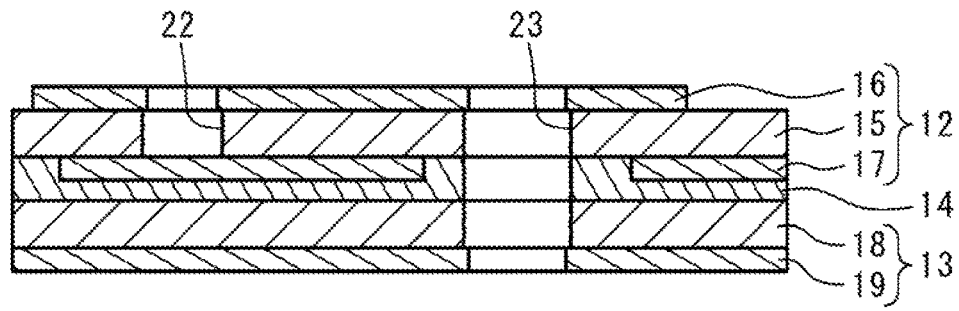
FIG. 10C is a schematic partial sectional view illustrating a step of producing the printed wiring board in FIG. 9, the step being performed subsequent to the step illustrated in FIG. 10B.

In the pre-treated surface formation step, as illustrated in FIG. 10C, a first pre-treated surface 22 is formed on an inner circumferential surface of the connection hole of the first base layer 15, and a second pre-treated surface 23 is formed on an inner circumferential surface of the connection hole of the first base layer 15, the adhesive 14, and the second base layer 18. The method for forming the first pre-treated surface 22 and the second pre-treated surface 23 may be the same as the method for forming the pre-treated surface 6 in FIG. 2C.

<Modified Layer Formation Step>

Figure 10D:
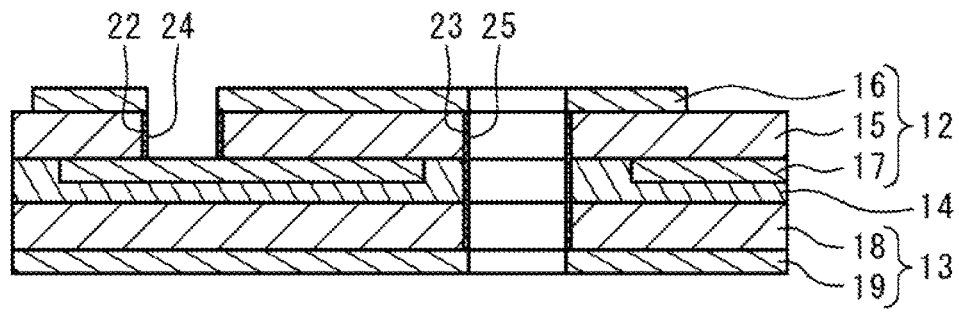
FIG. 10D is a schematic partial sectional view illustrating a step of producing the printed wiring board in FIG. 9, the step being performed subsequent to the step illustrated in FIG. 10C.

In the modified layer formation step, as illustrated in FIG. 10D, a first modified layer 24 and a second modified layer 25 are formed so as to be in contact with the first pre-treated surface 22 and the second pre-treated surface 23, respectively. The method for forming the first modified layer 24 and the second modified layer 25 may be the same as the method for forming the modified layer 7 in FIG. 2D.

<Underlying Conductor Layer Formation Step>

Figure 10E:
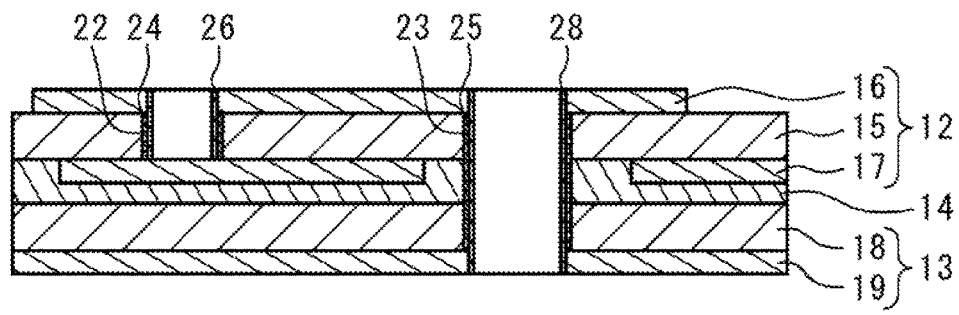
FIG. 10E is a schematic partial sectional view illustrating a step of producing the printed wiring board in FIG. 9, the step being performed subsequent to the step illustrated in FIG. 10D.

In the underlying conductor layer formation step, as illustrated in FIG. 10E, a first underlying conductor layer 26 and a second underlying conductor layer 28 are formed on the first pre-treated surface 22, the second pre-treated surface 23, an inner circumferential surface of the connection holes of the first conductive layer 16, and an inner circumferential surface of the connection hole of the third conductive layer 19. The method for forming the first underlying conductor layer 26 and the second underlying conductor layer 28 may be the same as the method for forming the underlying conductor layer 8 in FIG. 2E.

<Mask Formation Step>

Figure 10F:
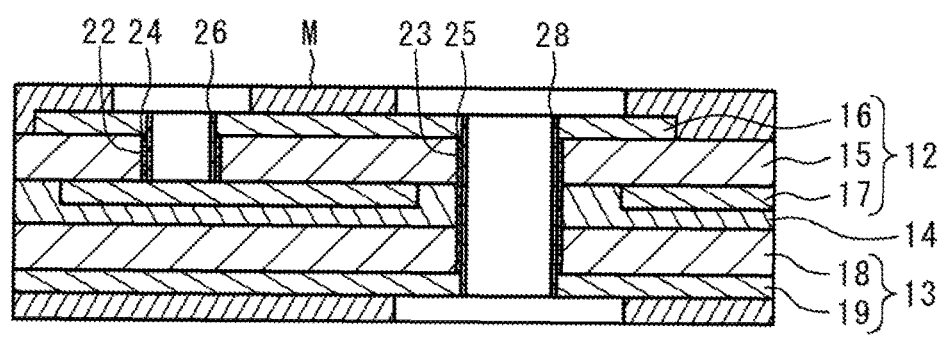
FIG. 10F is a schematic partial sectional view illustrating a step of producing the printed wiring board in FIG. 9, the step being performed subsequent to the step illustrated in FIG. 10E.

In the mask formation step, as illustrated in FIG. 10F, a mask M for plating, the mask M having openings in regions adjacent to the connection holes and partially exposing the first conductive layer 16 and the third conductive layer 19, is formed on each of a surface on the one side of the first substrate 12 and a surface on the other side of the second substrate 13.

For example, a known resist film, which can be patterned by photolithography, may be used as the mask M for plating. The method for forming the mask M for plating using photolithography is known, and thus a detailed description thereof is omitted.

<Main Conductor Layer Formation Step>

In the main conductor layer formation step, a metal is deposited by electroplating on the first underlying conductor layer 26, the second underlying conductor layer 28, and a part of the first conductive layer 16 and a part of the third conductive layer 19 that are exposed from the mask M for plating, all of which serve as an adherend, to form a first via-hole 20 and a second via-hole 21 of the printed wiring board 11 illustrated in FIG. 9. The electroplating in this main conductor layer formation step may be the same as the electroplating for forming the main conductor layer 9 of the printed wiring board 1 in FIG. 1.

<Mask Removal Step>

In the mask removal step, the mask M for plating is removed, and the printed wiring board 11 having the structure illustrated in FIG. 9 is thereby obtained. An example of the method for removing the mask M for plating is a method including using a stripper that is appropriately selected in accordance with the material of the mask M for plating. The stripper that can be used for removing the mask M for plating may be a stripper that is widely commercially available, and thus a detailed description thereof is omitted.

Other Embodiments

It is to be understood that the embodiments disclosed herein are only illustrative and are not restrictive in all respects. The scope of the present invention is not limited to the structures of the embodiments but is defined by the claims described below. It is intended that the scope of the present invention includes the meaning of equivalents of the claims and all modifications within the scope of the claims.

For example, the modified layer may be omitted in the printed wiring board of the present invention. Therefore, in the method for producing a printed wiring board of the present invention, the modified layer formation step may be omitted.

In the printed wiring board of the present invention, it is not necessary to form the pre-treated surface over the entire inner circumferential surface of a base layer in a connection hole. Specifically, the pre-treated surface may be partially formed in a part of the inner circumferential surface of a base layer in a connection hole.

In the printed wiring board of the present invention, the via-hole may have a single-layer structure formed by using a silver paste, a solder paste, or the like without forming an underlying conductor layer.

Ordinal numbers such as first, second, and third relating to the names of components of the printed wiring board of the present invention are assigned for the sake of convenience in order to distinguish the components from each other. Accordingly, the ordinal numbers assigned to components of each of the embodiments may be replaced, as required.

In the method for producing a printed wiring board of the present invention, regardless of the structure of the printed wiring board to be produced, as described in the first to fifth embodiments, after the formation of a via-hole, conductive layers having a main conductor layer thereon may be subjected to patterning to form a circuit pattern. Alternatively, as described in the sixth embodiment, a main conductor layer may be selectively formed on conductive layers that have been subjected to patterning to form a via-hole connecting the conductive layers to each other.

Examples

The present invention will now be described more specifically using Examples. However, the present invention is not limited to the Examples described below.

In order to confirm advantages of the present invention, layered structures that were the same as via-holes of printed wiring boards of the present invention were produced as a trial, and effects obtained by forming a pre-treated surface and a modified layer were evaluated. Specifically, a surface treatment was performed using a plurality of plasma gases on surfaces of base films containing a tetrafluoroethylene-hexafluoropropylene copolymer (FEP) as a main component. Samples having different pre-treated surfaces were prepared. Furthermore, a coupling agent was applied (modification treatment was performed) onto the surfaces of the base films each having the pre-treated surface and a surface of a base film that was not subjected to the surface treatment. Thus, samples having a modified layer were prepared. In addition, an underlying conductor layer was formed on the surface of each of the samples by electroless copper plating to prepare samples. Furthermore, base films each of which had a pre-treated surface and was not subjected to the modification treatment were prepared, and an underlying conductor layer was formed by electroless copper plating on the pre-treated surface of each of these base films. Subsequently, a main conductor layer having a thickness of 15 μm was further formed by copper electroplating on the surfaces of the underlying conductor layers to prepare samples. A film that did not substantially contain oxygen atoms or nitrogen atoms was used as the base film.

The plasma gas used was oxygen, water vapor, argon, ammonia, or nitrogen. The coupling agent used for forming the modified layer was 3-aminopropyltrimethoxysilane (silane coupling agent).

For each of the samples, the oxygen content ratio and the nitrogen content ratio of the pre-treated surface or the surface that was not subjected to the surface treatment, the contact angle of each of the surfaces with respect to pure water, and a surface resistance and a peel strength of the conductor layer were measured. Table 1 shows the oxygen content ratio and the nitrogen content ratio of the pre-treated surface, evaluation results of a pure-water contact angle reduction effect due to the surface treatment, evaluation results of a surface resistance reduction effect due to the surface treatment, evaluation results of a surface resistance reduction effect due to the formation of the modified layer, and evaluation results of the peel strength.

The "oxygen content ratio" and the "nitrogen content ratio" were values measured by X-ray photoelectron spectroscopy with an X-ray source of a K-alpha line of aluminum metal, with a beam diameter of 50 μm, and at an X-ray incident angle of 45° with respect to the analysis surface. Note that "<0.05%" in the table means that the content ratio was lower than 0.05%, which was the detection limit of the measuring apparatus, and could not be measured.

The "contact angle with respect to pure water" was measured in accordance with the sessile drop method in JIS-R-3257 (1999).

The "pure-water contact angle reduction effect due to surface treatment" was evaluated as follows. When a reduction ratio of the contact angle of the pre-treated surface with respect to pure water to the contact angle of the surface of the untreated base film with respect to pure water was less than 1%, the result was denoted by "D". When the reduction ratio was 1% or more and less than 10%, the result was denoted by "C". When the reduction ratio was 10% or more and less than 20%, the result was denoted by "B". When the reduction ratio was 20% or more, the result was denoted by "A". The contact angle of the untreated surface with respect to pure water was 100°.

The "surface resistance" was measured in accordance with JIS-C-2139 (2008).

The "surface resistance reduction effect due to surface treatment" was evaluated as follows. When a reduction ratio of the surface resistance of the underlying conductor layer formed on the pre-treated surface to the surface resistance of the underlying conductor layer formed on the surface of the untreated base film was less than 1%, the result was denoted by "D". When the reduction ratio was 1% or more and less than 10%, the result was denoted by "C". When the reduction ratio was 10% or more and less than 20%, the result was denoted by "B". When the reduction ratio was 20% or more, the result was denoted by "A". A resistance between two points on the electroless copper-plated surface, the two points being located 10 mm apart from each other, was measured as the resistance.

The "surface resistance reduction effect due to modification treatment" was evaluated as follows. When a reduction ratio of the surface resistance of the underlying conductor layer formed on the modified layer to the surface resistance of the underlying conductor layer formed on the pre-treated surface was less than 10%, the result was denoted by "B". When the reduction ratio was 10% or more, the result was denoted by "A".

The "peel strength of conductor layer" was measured in accordance with JIS-K-6854-2 (1999) "Adhesives—Determination of peel strength of bonded assemblies—Part 2: 180° peel". A reinforcing sheet formed of a glass-epoxy resin was bonded, with an adhesive, to a back surface of a base film sample having the main conductor layer thereon. The measurement was performed using a layered product of the underlying conductor layer and the main conductor layer as a flexible adherend. A peel strength of less than 0.1 N/cm was evaluated as "D". A peel strength of 0.1 N/cm or more and less than 1.0 N/cm was evaluated as "C". A peel strength of 1.0 N/cm or more and less than 3.0 N/cm was evaluated as "B". A peel strength of 3.0 N/cm or more was evaluated as "A". Note that the symbol "-" in Table 1 means that the measurement of the sample was not performed.

TABLE 1

| Plasma gas | Oxygen content ratio of pre-treated surface (atomic %) | Nitrogen content ratio of pre-treated surface (atomic %) | Pure-water contact angle reduction effect due to surface treatment | Surface resistance reduction effect due to surface treatment | Surface resistance reduction effect due to modification treatment | Peel strength of conductor layer |
|---|---|---|---|---|---|---|
| $O_2$ | 0.07 | <0.05 | D | D | A | D |
|  | 0.40 | <0.05 | C | C | A | C |
|  | 1.80 | <0.05 | B | B | A | B |
|  | 6.00 | <0.05 | A | A | A | B |
| $H_2O$ | 0.10 | <0.05 | D | D | A | D |
|  | 0.20 | <0.05 | C | C | A | C |
|  | 1.20 | <0.05 | B | B | A | C |
|  | 5.50 | 0.50 | A | A | A | B |
| Ar | 0.16 | <0.05 | D | D | A | D |
|  | 0.30 | <0.05 | C | C | A | C |
|  | 1.70 | <0.05 | B | B | A | B |
|  | 5.20 | 0.90 | A | A | A | B |
| $NH_3$ | <0.05 | 0.08 | D | D | A | D |
|  | <0.05 | 0.20 | C | C | A | C |
|  | <0.05 | 1.20 | B | B | A | A |
|  | <0.05 | 5.50 | A | A | A | A |
| $N_2$ | <0.05 | 0.15 | D | D | A | D |
|  | <0.05 | 0.30 | C | C | A | C |
|  | <0.05 | 1.10 | B | B | A | B |
|  | 0.20 | 5.80 | A | A | A | A |

These test results show that the I'm nation of a pre-treated surface having a content ratio of oxygen atoms or nitrogen atoms of 0.2 atomic percent or more can sufficiently reduce the contact angle with respect to pure water, sufficiently reduce the surface resistance of the conductor layer formed on the pre-treated surface, and improve the peel strength of the conductor layer.

The surface resistance reduction effect due to the modification treatment was good regardless of the type and degree of the surface treatment. However, in the case where only the modification treatment was performed without performing the surface treatment, the reduction ratio of the surface resistance was less than 10%, though the result is not shown in the table. Accordingly, the effect of improving the adhesion is increased when the modification treatment is combined with the pre-treated surface.

INDUSTRIAL APPLICABILITY

The printed wiring board according to the present invention is particularly suitably used as a wiring board that transmits high-frequency signals and that has a high degree of integration.

REFERENCE SIGNS LIST 1, 1a, 1b, 1c, 1d, 11 printed wiring board
2, 2d base layer
3 first conductive layer
4, 4b second conductive layer
5, 5a, 5b, 5c via-hole
6, 6d pre-treated surface
7 modified layer
8, 8a, 8b, 8c underlying conductor layer
9, 9a, 9b, 9c main conductor layer
10 reinforcing member
12 first substrate
13 second substrate
14 adhesive
15 first base layer
16 first conductive layer
17 second conductive layer
18 second base layer
19 third conductive layer
20 first via-hole
21 second via-hole
22 first pre-treated surface
23 second pre-treated surface
24 first modified layer
25 second modified layer
26 first underlying conductor layer
27 first main conductor layer
28 second underlying conductor layer
29 second main conductor layer
M mask for plating

The invention claimed is:

1. A printed wiring board comprising:
a base layer containing a fluororesin as a main component; a first conductive layer stacked on one surface of the base layer; a second conductive layer stacked on the other surface of the base layer; and
a via-hole that is formed along a connection hole penetrating the base layer and at least one of the first conductive layer and the second conductive layer in a thickness direction and that electrically connects the first conductive layer and the second conductive layer to each other,
wherein at least a part of an inner circumferential surface of the base layer in the connection hole has a pre-treated surface having a content ratio of oxygen atoms or nitrogen atoms of 0.2 atomic percent or more.

2. The printed wiring board according to claim 1, further comprising a modified layer having a hydrophilic organic functional group in at least a region of the inner circumferential surface of the base layer in the connection hole, the region having the pre-treated surface.

3. The printed wiring board according to claim 1, wherein the via-hole includes an underlying conductor layer that is in contact with an inner circumferential surface of the connection hole, and a main conductor layer that is in contact with an inner circumferential surface of the underlying conductor layer.

4. The printed wiring board according to claim 1, wherein a contact angle of the pre-treated surface with respect to pure water is 90° or less.

5. The printed wiring board according to claim 1, wherein a peel strength between the via-hole and the base layer is 1.0 N/cm or more.

* * * * *